(12) United States Patent
Sugawara

(10) Patent No.: US 8,679,907 B2
(45) Date of Patent: Mar. 25, 2014

(54) THIN-FILM TRANSISTOR ARRAY MANUFACTURING METHOD, THIN-FILM TRANSISTOR ARRAY, AND DISPLAY DEVICE

(75) Inventor: Yuta Sugawara, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/438,954

(22) Filed: Apr. 4, 2012

(65) Prior Publication Data
US 2013/0049004 A1 Feb. 28, 2013

Related U.S. Application Data

(63) Continuation of application No. PCT/JP2011/004769, filed on Aug. 26, 2011.

(51) Int. Cl.
*H01L 21/00* (2006.01)
*H01L 21/84* (2006.01)

(52) U.S. Cl.
USPC .......................................... 438/166; 438/158

(58) Field of Classification Search
USPC .................. 438/166, 487, 795, 158, 159, 486
IPC ..................... H01L 21/02532, 21/02675, 27/088
See application file for complete search history.

(56) References Cited

U.S. PATENT DOCUMENTS

| | | | |
|---|---|---|---|
| 7,662,703 B2 * | 2/2010 | Moriwaka et al. | 438/487 |
| 2010/0051949 A1 * | 3/2010 | Yamazaki et al. | 257/57 |

FOREIGN PATENT DOCUMENTS

| | | |
|---|---|---|
| JP | 10-189450 | 7/1998 |
| JP | 2007-220918 | 8/2007 |
| JP | 2011-066243 | 3/2011 |
| WO | 2011/033718 | 3/2011 |

OTHER PUBLICATIONS

U.S. Appl. No. 13/455,375 to Yuta Sugawara, filed Apr. 25, 2012.
U.S. Appl. No. 13/453,158 to Yuta Sugawara, filed Apr. 23, 2012.
U.S. Appl. No. 13/338,816 to Yuta Sugawara, filed Dec. 28, 2011.

* cited by examiner

*Primary Examiner* — George Fourson, III
*Assistant Examiner* — Wilner Jean Baptiste
(74) *Attorney, Agent, or Firm* — Greenblum & Bernstein, P.L.C.

(57) ABSTRACT

A method of manufacturing a thin-film transistor array includes: forming a gate insulating layer on gate electrodes; forming an amorphous silicon layer on the gate insulating layer; generating a crystalline silicon layer by crystallizing the amorphous silicon layer; and forming source electrodes and drain electrodes. The thicknesses of the gate insulating layer on the gate electrode is within a range in which there is a positive correlation between light absorbances of the amorphous silicon layer above the gate electrodes for the laser light and equivalent oxide thicknesses of the gate insulating layer on the gate electrodes. The thicknesses of the amorphous silicon layer above the gate electrodes is within a range in which variation of the light absorbances according to variation of the thicknesses of the amorphous silicon layer is within a predetermined range from a first standard.

16 Claims, 16 Drawing Sheets

THIN-FILM TRANSISTOR ARRAY MANUFACTURING METHOD, THIN-FILM TRANSISTOR ARRAY, AND DISPLAY DEVICE

CROSS REFERENCE TO RELATED APPLICATION

This is a continuation application of PCT Patent Application No. PCT/JP2011/004769 filed on Aug. 26, 2011, designating the United States of America. The entire disclosure of the above-identified application, including the specification, drawings and claims is incorporated herein by reference in its entirety.

TECHNICAL FIELD

Devices and methods consistent with an exemplary embodiment of this disclosure generally relate to a thin-film transistor array manufacturing method, a thin-film transistor array, and a display device.

BACKGROUND ART

A thin-film transistor (TFT) array is used in a liquid crystal panel or an organic electroluminescence (EL) panel, for example. Channel portions of thin-film transistors in the thin-film transistor array are made of amorphous silicon (a-Si) or polycrystalline silicon (poly-Si) which is a crystalline material. A crystalline silicon layer (poly-Si layer) of the channel portion of the thin-film transistor is typically provided by forming an amorphous silicon layer (a-Si layer) and then irradiating the amorphous silicon layer with laser light of an excimer laser or the like to instantly increase the temperature of the amorphous silicon layer so that the amorphous silicon layer is crystallized.

There are two types of thin-film transistor structures: one is a bottom-gate structure in which a gate metal is located on a substrate side with respect to x-Si (x is a or poly) of the channel portion; and the other is a top-gate structure in which a gate metal and a source-drain metal are located on a side opposite to the substrate side with respect to x-Si of the channel portion. The bottom-gate structure is mainly used in a-Si TFTs having a channel portion formed in an amorphous silicon layer, whereas the top-gate structure is mainly used in poly-Si TFTs having a channel portion formed in a crystalline silicon layer. Generally, the thin-film transistor structure used in a liquid crystal panel or an organic EL panel used in a large-area display device is the bottom-gate structure.

The bottom-gate structure may be used in a poly-Si TFT, which provides an advantage of lower manufacturing costs. Such a poly-Si TFT having the bottom-gate structure includes a crystalline silicon layer formed by irradiating an amorphous silicon layer with laser light to crystallize the amorphous silicon layer. In this method (laser annealing crystallization), the amorphous silicon layer is crystallized by heat generated by laser irradiation.

The thin-film transistors included in the thin-film transistor array used in, for example, an organic EL panel are particularly required to have uniform properties. To fulfill the requirements, techniques to form a crystalline silicon layer having uniform crystallinity over the surface of a substrate have been developed. However, the techniques have the following drawback (problem) when used for manufacturing thin-film transistors having a bottom-gate structure by laser annealing crystallization.

In manufacturing of thin-film transistors having a bottom-gate structure, an amorphous silicon layer is crystallized by laser annealing using laser light. The light absorbance of the amorphous silicon layer for the laser light is generally different between a region where a gate electrode is present (referred to as a "first region") and a region where a gate electrode is not present (referred to as a "second region"). This is because the presence of a gate electrode causes a change in the effect of multiple interference of the laser light in a multilayer thin film composed of an amorphous silicon layer and a gate insulating layer.

The difference in the light absorbance of the amorphous silicon layer between the two regions causes a difference in the increased temperature of the amorphous silicon layer between the two regions immediately after the laser irradiation. This results in uneven temperature distribution in the amorphous silicon layer. The crystallinity of the crystalline silicon layer formed by laser annealing crystallization highly depends on the increased temperature of the amorphous silicon layer as a result of laser irradiation. The uneven distribution of increased temperature in the amorphous silicon layer between the two regions causes a problem of unevenness in crystallinity of a resultant crystalline silicon layer.

For example, Japanese Unexamined Patent Application Publication No. 2007-220918 (Patent Reference 1) discloses a technique to solve the problem. Patent Reference 1 discloses that by using the technique, a gate insulating layer and an amorphous silicon layer are adjusted in thickness so that a thickness configuration can be achieved in which the amorphous silicon layer has uniform light absorbance across the first region and the second region. Unevenness in the increased temperature of the amorphous silicon layer between the regions immediately after laser irradiation is thus minimized so that a crystalline silicon thin film of uniform crystallinity can be formed over the surface of a substrate.

However, the technique disclosed in Patent Reference 1 has a problem that a crystalline silicon thin film of uniform crystallinity cannot be formed over the surface of a substrate in the case shown below. The problem is caused in the following way.

Generally, in a process of manufacturing a thin-film transistor array for a display device, an amorphous silicon layer and a gate insulating layer are formed using a process such as plasma-enhanced chemical vapor deposition (PECVD). A thin film formed using such a process has varied thicknesses to a certain degree within the surface of a substrate, depending on deposition conditions.

In this case, that is, in the case where the amorphous silicon layer or the gate insulating layer has varied thicknesses within the surface of a substrate, the light absorbance unavoidably varies according to the variation of the thicknesses (deviations from an targeted thickness).

The thickness of the amorphous silicon layer or the gate insulating layer still varies within the surface of the substrate even when the amorphous silicon layer and the gate insulating layer are formed to have thicknesses so that the light absorbance of the amorphous silicon layer is uniform across the first region and the second region. The amorphous silicon layer therefore fails to have uniform light absorbance across the first region and the second region throughout the surface of the substrate.

In other words, when an amorphous silicon layer or a gate insulating layer is formed using a process such as plasma-enhanced chemical vapor deposition, it is impossible to heat an amorphous silicon layer to a temperature uniform across the first region and the second region. This causes a problem of uneven crystallinity of a resulting crystalline silicon layer within the surface of the substrate.

There is a disclosed technique to address the problem in which the focus is on regions where channels of thin-film transistors are formed (first regions). In the technique, a crystalline silicon layer is formed so that the crystalline silicon layer has uniform crystallinity in the first regions (see Japanese Unexamined Patent Application Publication No. 2011-066243 (Patent Reference 2), for example).

According to Patent Reference 2, an amorphous silicon layer and a gate insulating layer are formed using conditions of thickness to minimize variation in light absorbance of the amorphous silicon layer above the first regions so that the crystallinity of the crystalline silicon layer above the first regions is uniform over the substrate. Use of such conditions allows for minimization of the impact of variation in the thickness of the amorphous silicon layer and variation in the thickness of the gate insulating layer on temperature increase of the amorphous silicon layer above the first regions as a result of laser annealing and on crystallinity of a resulting crystalline silicon layer.

CITATION LIST

Patent Literature

[Patent Literature 1] Japanese Unexamined Patent Application Publication No. 2007-220918
[Patent Literature 2] Japanese Unexamined Patent Application Publication No. 2011-066243

SUMMARY OF INVENTION

Technical Problem

However, the use of the technique disclosed in Patent Reference 2 still has the following problem. The problem is that even when the crystalline silicon layer is provided with uniform crystallinity in the first regions over the substrate, it is impossible to provide the thin-film transistors having channels in the first regions of the crystalline silicon layer with uniform properties, especially with uniform on-state properties.

This is because the on-state properties of thin-film transistors depend not only on the crystallinity of a crystalline silicon layer in which channels are formed but also on the gate capacitance of the gate insulating layer. In other words, the variation in the thickness of the gate insulating layer over the substrate causes the variation in the gate capacitance of the gate insulating layer, and the variation in the gate capacitance causes variation in the on-state properties of the thin-film transistors even when the thin-film transistors have uniform crystallinity.

FIG. 1 shows distribution of on-state currents of thin-film transistors in a thin-film transistor array within the surface of a substrate. Here, the thin-film transistor array shown in FIG. 1 is composed of bottom-gate TFTs in which a crystalline silicon layer formed by laser annealing crystallization is used. In the drawing, 224×224 thin-film transistors formed on the substrate compose the thin-film transistor array. FIG. 1 visually shows distribution of on-state currents of the thin-film transistors in a thin-film transistor array within the surface of a substrate by representing the magnitude of on-state currents by shades of gray. The on-state currents are normalized and indicated by arbitrary units.

As shown in FIG. 1, the on-state currents of the thin-film transistors are varied within the surface of the substrate, providing the thin-film transistors with uneven properties. The unevenness of properties is caused by variation in the gate insulating layer capacitance above gate electrodes due to difference in the thickness of the gate insulating layer within the surface of the substrate of the thin-film transistor array, as described above.

In FIG. 1, the gate insulating layer is thicker in the central part of the surface of the substrate of the thin-film transistor array than in the peripheral part, so that the capacitance of the gate insulating layer is lower in the central part. The on-state properties therefore degrade in the central part. In other words, FIG. 1 shows the central part with the degraded on-state properties in darker gray.

Control of variation in a layer where channels of thin-film transistors are formed is more difficult when a larger substrate is used for manufacturing panels. Accordingly, gate capacitance of thin-film transistors in a thin-film transistor array used in a larger display device has larger variation. Even when a crystalline silicon layer is successfully formed to have uniform crystallinity over the substrate, the on-state properties of the thin-film transistors will have more prominent variation due to variation in gate capacitances. Thus, the problem of uneven picture representation due to variation in the on-state properties of thin-film transistors will be more serious in the case of manufacture of a large-area display device.

An exemplary embodiment of this disclosure may overcome the above disadvantage and other disadvantages not described here. However, it is understood that the exemplary embodiment of this disclosure is not required to overcome or may not overcome the disadvantage described above and other disadvantages not described here. The exemplary embodiment of this disclosure provides a method of manufacturing a thin-film transistor array composed of thin-film transistors having uniform on-state properties, such a thin-film transistor array, and a display device in which such a thin-film transistor array is used.

Solution to Problem

According to an aspect of the exemplary embodiment of this disclosure, the method of manufacturing a thin-film transistor array includes: preparing a substrate; forming a plurality of gate electrodes above the substrate; forming a gate insulating layer on the gate electrodes; forming an amorphous silicon layer on the gate insulating layer; generating a crystalline silicon layer by crystallizing the amorphous silicon layer using laser light emitted from a laser; and forming a source electrode and a drain electrode for each of the gate electrodes, the source electrode and the drain electrode being located in a region above the crystalline silicon layer, wherein in the forming of a gate insulating layer, the gate insulating layer is formed such that thicknesses of the gate insulating layer on the gate electrodes are within a range in which there is a positive correlation between light absorbances of the amorphous silicon layer above the gate electrodes for the laser light and equivalent oxide thicknesses of the gate insulating layer on the gate electrodes, and in the forming of an amorphous silicon layer, the amorphous silicon layer is formed such that thicknesses of the amorphous silicon layer above the gate electrodes is within a range in which variation of the light absorbances according to variation of the thicknesses of the amorphous silicon layer is within a predetermined range from a first standard.

Advantageous Effects of Invention

According to aspects of the exemplary embodiment of this disclosure, provided are a method of manufacturing a thin-film transistor array composed of thin-film transistors having uniform on-state properties, such a thin-film transistor array, and a display device using such a thin-film transistor array.

Specifically, provided are a thin-film transistor array manufacturing method, a thin-film transistor array, and a display device in which the thin-film transistor array is used. In the method, an amorphous silicon layer and a gate layer are formed so that the thickness of each of them above the gate electrode regions of thin-film transistors arranged in array on a substrate conform to predetermined conditions. Then, a crystalline silicon layer is formed using laser light having a wavelength within the visible spectrum to have crystallinity varied so as to offset impact of variation of the gate capacitances of the gate insulating layer above the first regions, so that the thin-film transistors in the thin-film transistor array formed over a substrate have uniform on-state properties.

BRIEF DESCRIPTION OF DRAWINGS

These and other objects, advantages and features of the exemplary embodiment of this disclosure will become apparent from the following description thereof taken in conjunction with the accompanying drawings that illustrate general and specific exemplary embodiment. In the Drawings.

DESCRIPTION OF EMBODIMENT

Embodiment 1

Figure 1:
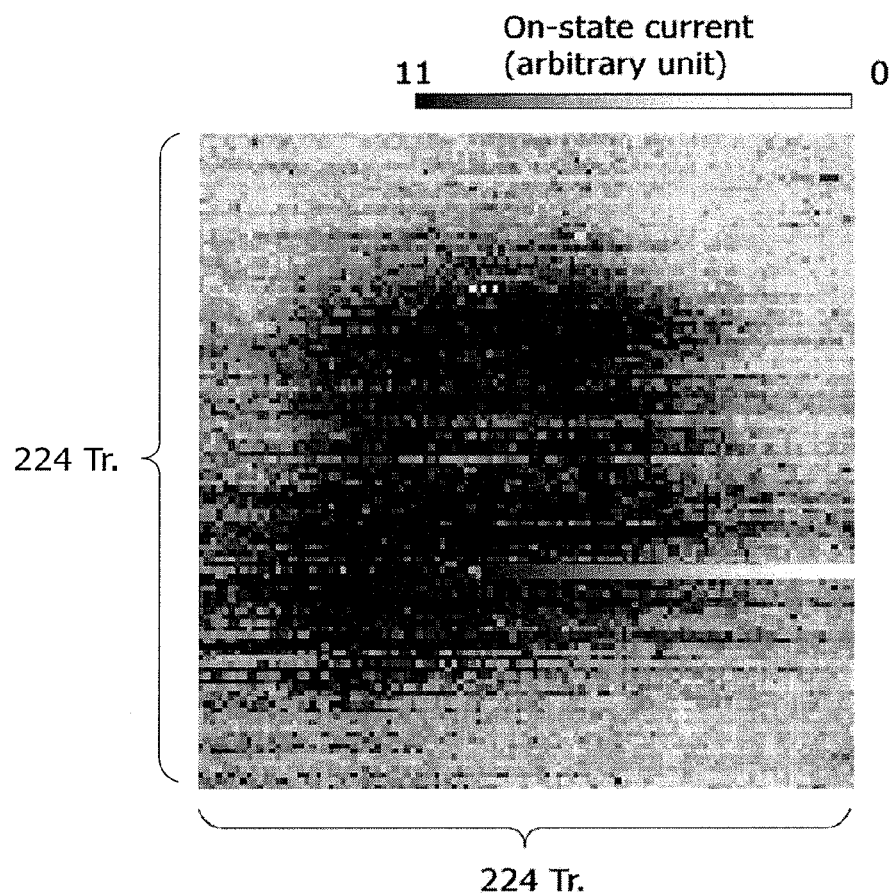
FIG. 1 shows distribution of on-state currents of thin-film transistors in a thin-film transistor array within a surface of a substrate.

A method of manufacturing a thin-film transistor array according to a first aspect includes: preparing a substrate; forming a plurality of gate electrodes above the substrate; forming a gate insulating layer on the gate electrodes; forming an amorphous silicon layer on the gate insulating layer; generating a crystalline silicon layer by crystallizing the amorphous silicon layer using laser light emitted from a laser; and forming a source electrode and a drain electrode for each of the gate electrodes, the source electrode and the drain electrode being located in a region above the crystalline silicon layer, wherein in the forming of a gate insulating layer, the gate insulating layer is formed such that thicknesses of the gate insulating layer on the gate electrodes are within a range in which there is a positive correlation between light absorbances of the amorphous silicon layer above the gate electrodes for the laser light and equivalent oxide thicknesses of the gate insulating layer on the gate electrodes, and in the forming of an amorphous silicon layer, the amorphous silicon layer is formed such that thicknesses of the amorphous silicon layer above the gate electrodes is within a range in which variation of the light absorbances according to variation of the thicknesses of the amorphous silicon layer is within a predetermined range from a first standard.

Here, the equivalent oxide thickness is the thickness of a $SiO_2$ film electrically equivalent to the physical thickness of the gate insulating layer.

According to this aspect of the present invention, there is a negative correlation between the light absorbance of the amorphous silicon layer above the gate electrodes of the thin-film transistors included in the thin-film transistor array for the laser light used for laser annealing of the amorphous silicon layer and the gate insulating layer capacitance in the regions also above the gate electrode, even when the thickness of the amorphous silicon layer is varied with respect to an targeted thickness. With the correlation, the crystalline silicon layer can be formed so that the crystallinity of the crystalline silicon layer corresponds to the distribution of the gate insulating layer capacitances above the gate electrodes within the surface of the substrate even in the case where the thickness of the gate insulating layer in the thin-film transistor array is varied. Specifically, the crystalline silicon layer generated by the laser annealing has crystallinity distribution such that crystallinity above a gate electrode is lower for higher gate insulating layer capacitance. Furthermore, the thin-film transistor array is formed using a crystalline silicon layer in which the crystallinity is varied so as to be in a certain correlation with the gate insulating layer capacitance within the surface of the substrate. In this configuration, an effect is produced that the variation caused by variation among the thin-film transistors in the gate insulating layer capacitance due to the variation in the thickness of the gate insulating layer is offset by the crystalline silicon layer which is the channel layer of the thin-film transistors and has controlled crystallinity.

A method of manufacturing a thin-film transistor array according to a second aspect is the method wherein the laser includes a solid-state laser device.

A method of manufacturing a thin-film transistor array according to a third aspect is the method wherein the laser includes a laser device using a semiconductor laser element.

A method of manufacturing a thin-film transistor array according to a fourth aspect of the present invention is the method wherein in the generating of a crystalline silicon layer, a variation of irradiation energy density of the laser light on the amorphous silicon layer is less than approximately 5%.

A method of manufacturing a thin-film transistor array according to a fifth aspect is the method wherein the laser light has a wavelength from 400 nanometers to 600 nanometers.

A method of manufacturing a thin-film transistor array according to a sixth aspect is the method wherein in the forming of an amorphous silicon layer, the amorphous silicon layer is formed to have the thicknesses within the range in which the light absorbances are within the predetermined range from the first standard so that a derivative of absorbance of the amorphous silicon layer for a laser light having a wavelength $\lambda$ differentiated with respect to optical thickness of the amorphous silicon layer is from −5 to +5, the absorbance being normalized to optical thickness of the gate insulating layer normalized to the wavelength $\lambda$ of the laser light, and the optical thickness of the amorphous silicon layer being normalized to the wavelength $\lambda$ of the laser light.

A method of manufacturing a thin-film transistor array according to a seventh aspect is the method wherein in the forming of an amorphous silicon layer, the amorphous silicon layer is formed such that an average of the thicknesses of the amorphous silicon layer above the gate electrodes is within a range represented by Expression 1 below.

Expression 1 is $0.426 \leq n_{a\text{-}Si} \times d_{a\text{-}Si}/\lambda_{Si} \leq 0.641$, where $d_{a\text{-}Si}$ denotes the average of the thicknesses of the amorphous silicon layer, $\lambda_{Si}$ denotes a wavelength of the laser light, and $n_{a\text{-}Si}$ denotes a refractive index of the amorphous silicon layer for a laser light having a wavelength $\lambda$.

A method of manufacturing a thin-film transistor array according to an eighth aspect is the method wherein in the forming of a gate insulating layer, the gate insulating layer is formed to have an extinction coefficient of 0.01 or below for a wavelength of the laser light.

A method of manufacturing a thin-film transistor array according to a ninth aspect is the method wherein the gate insulating layer is a silicon oxide film.

A method of manufacturing a thin-film transistor array according to a tenth aspect is the method wherein the gate insulating layer is a silicon nitride film.

A method of manufacturing a thin-film transistor array according to an eleventh aspect is the method wherein the gate insulation layer is composed of stacked films including a silicon oxide film and a silicon nitride film.

A method of manufacturing a thin-film transistor array according to a twelfth aspect is the method wherein in the forming of a gate insulating layer, the gate insulating layer is formed such that an average of the thicknesses of the gate insulating layer on the gate electrodes is within a range represented by one of Expression 2 and Expression 3 below.

Expression 2 is $0.44 \leq n_{GI} \times d_{GI}/\lambda \leq 0.74$, and Expression 3 is $0.96 \leq n_{GI} \times d_{GI}/\lambda \leq 1.20$, where $d_{GI}$ denotes the average of the thicknesses of the gate insulating layer, $\lambda$ denotes a wavelength of the laser light, and $n_{GI}$ denotes a refractive index of the gate insulating layer for the laser light having the wavelength $\lambda$.

A method of manufacturing a thin-film transistor array according to a thirteenth aspect is the method wherein in the forming of a gate insulating layer, the gate insulating layer is formed such that an average of the thicknesses of the gate insulating layer on the gate electrodes is within a range represented by one of Expression 4 and Expression 5 below.

Expression 4 is $0.47 \leq n_{GI} \times d_{GI}/\lambda \leq 0.62$, and Expression 5 is $1.04 \leq n_{GI} \times d_{GI}/\lambda \leq 1.13$, where $d_{GI}$ is the average of the thicknesses of the gate insulating layer, $\lambda$ is a wavelength of the laser light, and $n_{GI}$ is a refractive index of the gate insulating layer for the laser light having the wavelength $\lambda$.

A method of manufacturing a thin-film transistor array according to a fourteenth aspect is the method wherein in the forming of a gate insulating layer, the gate insulating layer is formed such that an average of thicknesses of the silicon oxide film above the gate electrodes and an average of thicknesses of the silicon nitride film above the gate electrodes are within one of a range represented by Expression 6 and Expression 7 below and a range represented by Expression 8 and Expression 9 below.

Expression 6 is $Y \geq -1070X^6 + 1400X^5 - 688X^4 + 153X^3 - 12.90X^2 - 1.02X + 0.43$, Expression 7 is $Y \leq 49.9X^6 - 131X^5 + 127X^4 - 56.8X^3 + 11.8X^2 - 2.01X + 0.736$, Expression 8 is $Y \geq -7.34X^6 + 8.48X^5 + 8.65X^4 - 16.0X^3 + 7.24X^2 - 2.04X + 0.961$, and Expression 9 is $Y \leq -3.75X^6 + 11.8X^5 - 13.1X^4 + 6.09X^3 - 1.12X^2 - 0.87X + 1.20$, where $X = d_{SiO} \times n_{SiO}/\lambda$ and $Y = d_{SiN} \times n_{SiN}/\lambda$, $d_{SiO}$ denotes the average of the thicknesses of the silicon oxide film, $d_{SiN}$ denotes the average of the thicknesses of the silicon nitride film, $\lambda$ denotes a wavelength of the laser light, $n_{SiO}$ denotes a refractive index of the silicon oxide film for the laser light having the wavelength $\lambda$, and $n_{SiN}$ denotes a refractive index of the silicon nitride film for the laser light having the wavelength $\lambda$.

A method of manufacturing a thin-film transistor array according to a fifteenth aspect is the method wherein in the forming of a gate insulating layer, the gate insulating layer is formed such that an average of thicknesses of the silicon oxide film above the gate electrodes and an average of thicknesses of the silicon nitride film above the gate electrodes are within one of a range represented by Expression 10 and Expression 11 below and a range represented by Expression 12 and Expression 13 below.

Expression 10 is $Y \geq -132.6X^6 + 181X^5 - 93.8X^4 + 21.3X^3 - 1.33X^2 - 1.04X + 0.473$, Expression 11 is $Y \leq 23.7X^6 - 4.56X^5 - 35.4X^4 + 27.2X^3 - 5.75X^2 - 0.973X + 0.619$, Expression 12 is $Y \geq 7.46X^6 - 32.4X^5 + 50.8X^4 - 35.7X^3 + 11.0X^2 - 2.20X + 1.04$, and Expression 13 is $Y \leq 5.34X^6 + 16.7X^5 - 18.7X^4 + 9.18X^3 - 1.96X^2 - 0.821X + 1.13$, where $X = d_{SiO} \times n_{SiO}/\lambda$ and $Y = d_{SiN} \times n_{SiN}/\lambda$, $d_{SiO}$ denotes the average of thicknesses of the silicon oxide film, $d_{SiN}$ denotes the average of thicknesses of the silicon nitride film, $\lambda$ denotes a wavelength of the laser light, $n_{SiO}$ denotes a refractive index of the silicon oxide film for the laser light having the wavelength $\lambda$, and $n_{SiN}$ denotes a refractive index of the silicon nitride film for the laser light having the wavelength $\lambda$.

A method of manufacturing a thin-film transistor array according to a sixteenth aspect is the method wherein in the forming of a plurality of gate electrodes, an undercoat layer composed of a transparent insulating film is formed on the substrate, and the plurality of gate electrodes is formed on the undercoat layer.

A thin-film transistor array according to a seventeenth aspect includes: a substrate; a plurality of gate electrodes formed above the substrate; a gate insulating layer formed commonly on the gate electrodes; a crystalline silicon layer formed on the gate insulating layer; and a source electrode and a drain electrode formed in a region above the crystalline silicon layer for each of the gate electrodes, wherein the crystalline silicon layer is formed by crystallizing an amorphous silicon layer formed on the gate insulating layer, using laser light emitted from a laser, the gate insulating layer is formed to have such that thicknesses of the gate insulating layer on the gate electrodes are within a range in which there is a positive correlation between light absorbances of the amorphous silicon layer above the gate electrodes for the laser light and equivalent oxide thicknesses of the gate insulating layer, and the amorphous silicon layer is formed such that thicknesses of the amorphous silicon layer above the gate electrodes is within a range in which variation of the light absorbances according to variation of the thicknesses of the amorphous silicon layer is within a predetermined range from a first standard.

A thin-film transistor array according to an eighteenth aspect is the thin-film transistor array wherein there is a negative correlation between an average crystal grain size of the crystalline silicon layer above the gate electrode and gate capacitance of the gate insulating layer on the gate electrode.

A thin-film transistor array according to a nineteenth aspect is the thin-film transistor array wherein there is a positive correlation between a half-width of a peak around 520 cm$^{-1}$ of a Raman scattering spectrum of the crystalline silicon layer above the gate electrodes and gate capacitance of the gate insulating layer on the gate electrodes.

A display device according to a twentieth aspect is a display device including one of a liquid crystal panel and an electroluminescence (EL) panel, the display device including the thin-film transistor array according to any one of the seventeenth to nineteenth aspects, wherein the thin-film transistor array drives the one of the liquid crystal panel or the EL panel.

An embodiment of the present invention shall be described below with reference to drawings.

Figure 2:
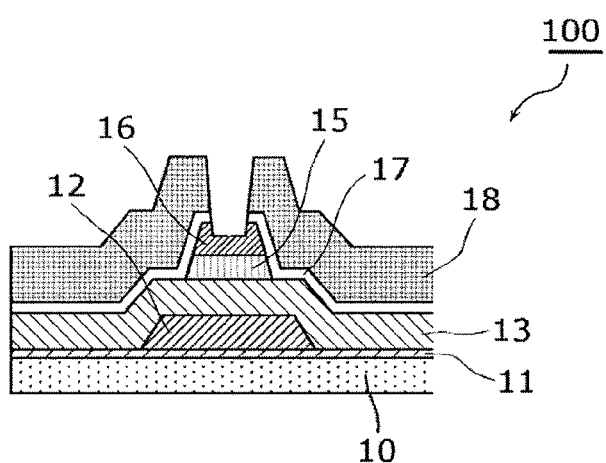
FIG. 2 illustrates a cross-sectional view showing a structure of a thin-film transistor included in a thin-film transistor array according to an exemplary embodiment of this disclosure.

FIG. 2 illustrates a cross-sectional view showing a thin-film transistor included in a thin-film transistor array for use in a display device according to an embodiment of the present invention.

A thin-film transistor 100 shown in FIG. 2 is a thin-film transistor of the bottom-gate structure, and includes a substrate 10, an undercoat layer 11, a gate electrode 12, a gate insulating layer 13, a crystalline silicon layer 15, an amorphous silicon layer 16, an n+ silicon layer 17, and source and drain electrodes 18.

The substrate 10 is an insulation substrate made of, for example, transparent glass or quartz.

The undercoat layer 11 is formed on the substrate 10, and is composed of, for example, a silicon oxide (SiNx) layer, a silicon nitride (SiOx) layer, or stacked layers including a silicon oxide layer and a silicon nitride layer. It is preferable that the undercoat layer 11 includes silicon oxide (SiOx) where 1.5<x<2.0, with a thickness of 300 nanometers to 1500 nanometers. A more, preferable thickness range of the undercoat layer 11 is from 500 nanometers to 1000 nanometers. This is because the undercoat layer 11 having a large thickness can reduce heat load on the substrate 10, but the undercoat layer 11 having an excessively large thickness may peel off or have a crack.

The gate electrode 12 is formed on the undercoat layer 11, and is typically made of a metal such as molybdenum (Mo) or a Mo alloy (for example, MoW (molybdenum-tungsten alloy)). The gate electrode 12 can be made of any metal withstanding a melting point of silicon, such as an alloy of tungsten (W), tantalum (Ta), niobium (Nb), nickel (Ni), chromium (Cr), Mo, or the like. The gate electrode 12 preferably has a thickness of 30 nanometers to 300 nanometers, and more preferably has a thickness of 50 nanometers to 100 nanometers. This is because the gate electrode 12 having smaller thickness has higher transmittance so that the reflectance for laser light described below is likely to decrease. On the other hand, the gate electrode 12 having a large thickness is covered by the gate insulating layer 13 at a poor coverage so that the properties of the thin-film transistor 100 are likely to degrade. For example, a stepped cut of the gate insulation film at an end of the gate electrode 12 provides electrical conduction between the gate electrode 12 and the n+ silicon layer 17.

The gate insulating layer 13 is formed so as to cover the gate electrode 12, and is composed of, for example, a silicon oxide layer, a silicon nitride layer, or a stacked layers of a silicon oxide layer and a silicon nitride layer. The gate insulating layer is typically formed using a CVD apparatus. Because of the characteristics of the CVD apparatus, the distribution of thicknesses of the gate insulating layer 13 on gate electrodes 12 above the substrate 10 may vary by approximately ±15% with respect to a targeted thickness. Regardless of the configuration of the gate insulating layer 13, the gate insulating layer 13 on the gate electrodes 12 is formed to have thicknesses within a range in which there is a positive correlation between the equivalent oxide thicknesses of the gate insulating layer 13 on the gate electrodes 12 and the light absorbances of the amorphous silicon layer 14 above the gate electrodes 12 for laser light. Here, the equivalent oxide thickness is a thickness of a $SiO_2$ film electrically equivalent to a physical thickness of a gate insulating layer.

In other words, the gate insulating layer 13 is formed to have thicknesses within a range in which there is a negative correlation between the gate capacitances of the gate insulating layer 13 on the gate electrodes 12 and the light absorbances of the amorphous silicon layer 14 above the gate electrodes 12 for laser light. This means that the thicknesses of the gate insulating layer 13 should have a distribution (or a distribution center) appropriate for forming the crystalline silicon layer 15 by laser annealing crystallization. The appropriate distribution is represented by given relational expressions suitable for the structure of the gate insulating layer 13 and the types of the layers of structure, which will be detailed later.

The crystalline silicon layer 15 is formed on the gate insulating layer 13 and is composed of a polycrystalline silicon layer (poly-Si layer). The crystalline silicon layer 15 is provided by forming an amorphous silicon layer 14 (not shown) of a-Si on the gate insulating layer 13 and then irradiating the amorphous silicon layer 14 with laser light to make the amorphous silicon layer 14 polycrystalline (or microcrystalline).

The term "polycrystalline" used here has a broad meaning that includes not only a polycrystalline structure which is narrowly interpreted as being made up of crystals of 50 nanometers or larger but also a microcrystalline structure which is narrowly interpreted as being made up of crystals of 50 nanometers or smaller. Hereinafter, the term "polycrystalline" is used in the broad meaning.

A laser light source for the laser irradiation emits laser light having a wavelength within the visible spectrum. Specifically, the laser light having a wavelength within the visible spectrum is laser light having a wavelength of approximately 380 nanometers to 780 nanometers, and is preferably laser light having a wavelength from 400 nanometers to 600 nanometers. Use of laser light within the range is preferable because laser light having a wavelength shorter than 400 nanometers, or ultra violet light, does not cause effective multiple interference so that absorbance of the amorphous silicon layer for laser light fails to change according to variation in thickness of the gate insulating layer 13, and it is therefore impossible to achieve an advantageous effect expected in the present invention. On the other hand, use of laser light having a wavelength longer than 600 nanometers is not preferable from the viewpoint of productivity because absorbance of the amorphous silicon layer 14 for the laser light is so low that laser crystallization results in poor efficiency.

The laser light having a wavelength within the visible spectrum may oscillate in any one of pulsed wave mode, continuous wave mode, and quasi-continuous wave mode.

The amorphous silicon layer 14 is made of amorphous silicon, or a-Si, and formed on the gate insulating layer 13. The amorphous silicon layer 14 is formed so as to have thicknesses within a range in which variation of the light absorbances of the amorphous silicon above the gate electrodes 12 for the laser light is moderate for variation of the thicknesses of the amorphous silicon layer 14. This means that the thicknesses of the amorphous silicon layer 14 should have a distribution (or a distribution center) appropriate for forming the crystalline silicon layer 15 by laser annealing crystallization. The appropriate distribution is represented by given relational expressions suitable for the refractive index of the amorphous silicon layer 14 and the wavelength of laser light for laser crystallization, which will be detailed later.

The amorphous silicon layer 16 is formed on the crystalline silicon layer 15. The thin-film transistor 100 has a channel layer in which the amorphous silicon layer 16 is thus stacked on the crystalline silicon layer 15.

The n+ silicon layer 17 is formed so as to cover the gate insulating layer 13 and the side surfaces of the amorphous silicon layer 16 and the side surfaces of the crystalline silicon layer 15.

The source and drain electrodes 18 are formed on the n+ silicon layer 17, and made of a metal material, such as Mo, a Mo alloy, titanium (Ti), aluminum (Al), an Al alloy, copper (Cu), a Cu alloy, silver (Ag), chromium (Cr), tantalum (Ta), or tungsten (W).

The thin-film transistor 100 is configured as described above.

Figure 3:
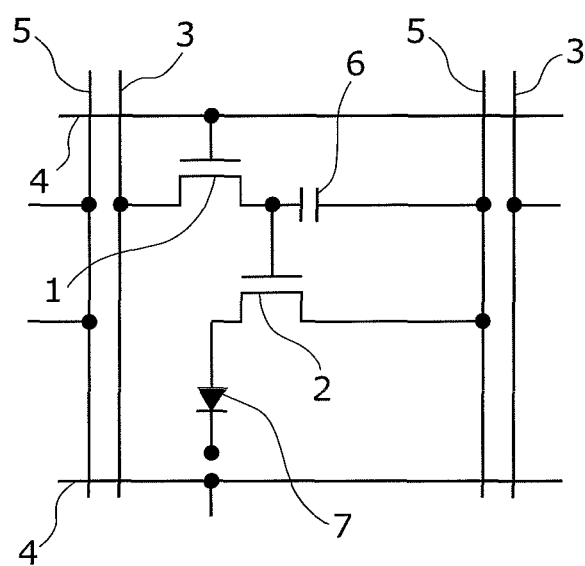
FIG. 3 is a diagram showing an example of an equivalent circuit of a unit cell in the thin-film transistor array according to the exemplary embodiment of this disclosure.

FIG. 3 is a diagram showing an example of an equivalent circuit of a repeating unit cell in the display device according to the embodiment of the present invention. The equivalent circuit shown in FIG. 3 includes a switching transistor 1, a driver transistor 2, a data line 3, a scan line 4, a current supply line 5, a capacitor 6, and a light-emitting element 7.

The switching transistor 1 is connected to the data line 3, the scan line 4, and the capacitor 6.

The driver transistor 2 corresponds to, for example, the thin-film transistor 100 shown in FIG. 2, and is connected to the current supply line 5, the capacitor 6, and the light-emitting element 7.

The data line 3 is a line through which data (the magnitude of voltage) for determining brightness of a pixel of the light-emitting element 7 is transmitted to the pixel of the light-emitting element 7.

The scan line 4 is a line through which data for determining ON and OFF of the pixel of the light-emitting element 7 is transmitted to the pixel of the light-emitting element 7.

The current supply line 5 is a line for supplying a large current to the driver transistor 2.

The capacitor 6 holds a voltage (charge) for a certain period of time.

The display device is configured as described above.

A method of manufacturing the thin-film transistor 100 included in the above-described thin-film transistor array shall be described below.

Figure 4:
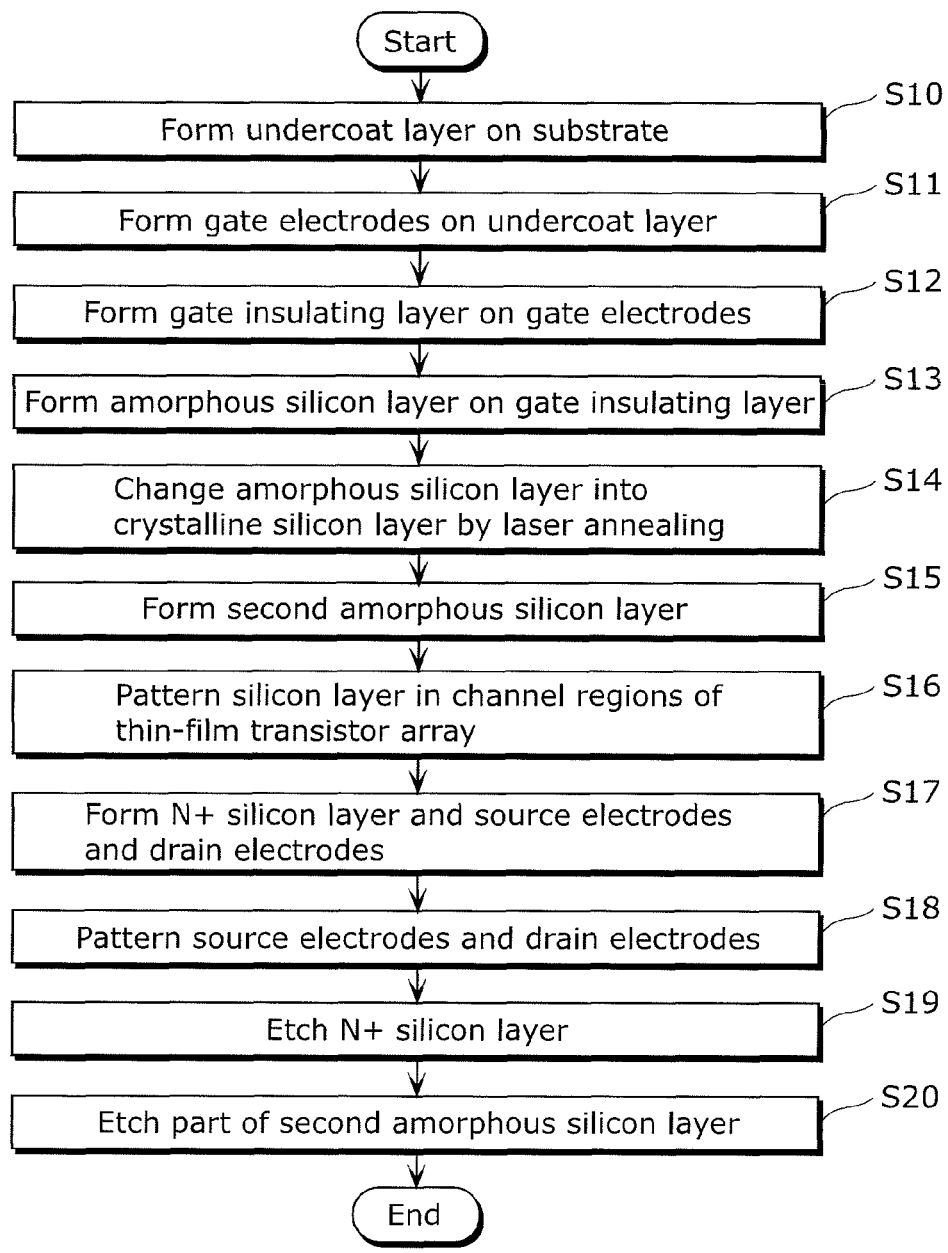
FIG. 4 is a flowchart showing processes of manufacturing the thin-film transistor included in the thin-film transistor array according to the exemplary embodiment of this disclosure.
Figure 5A:
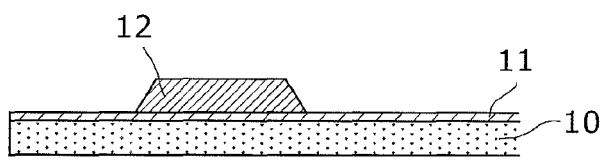
FIG. 5A illustrates a cross-sectional view showing for describing a method of manufacturing the thin-film transistor included in the thin-film transistor array according to the exemplary embodiment of this disclosure.
Figure 5B:
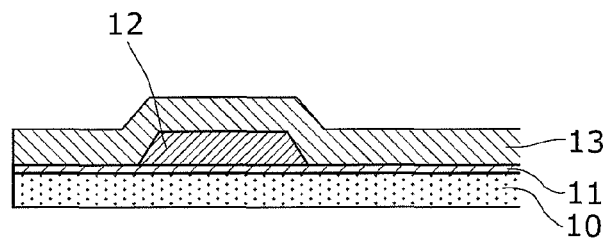
FIG. 5B illustrates a cross-sectional view showing for describing the method of manufacturing the thin-film transistor included in the thin-film transistor array according to the exemplary embodiment of this disclosure.

FIG. 4 is a flowchart showing processes of manufacturing the thin-film transistor included in the thin-film transistor array for use in the display device according to the embodiment of the present invention. Although actually a plurality of thin-film transistors 100 is manufactured at once, the following describes the method as a method of manufacturing one thin-film transistor for simplicity. FIGS. 5A to 5J are diagrams for describing the method of manufacturing the thin-film transistor used in the display device according to the embodiment of the present invention. FIG. 6 is a diagram schematically showing laser annealing in Step S14 shown in FIG. 4.

First, the substrate 10 is prepared, and the undercoat layer 11 is formed on the substrate 10 (Step S10). Next, the gate electrode is formed on the undercoat layer 11 (Step S11).

Specifically, the undercoat layer 11 is formed on the substrate 10 by plasma CVD. Subsequently, a metal film to be the gate electrode is deposited by sputtering. Then, the gate electrode 12 in the thin-film transistor 100 is formed by photolithography and etching (FIG. 5A). Here, the gate electrode 12 is typically made of a metal material such as Mo or a Mo alloy (for example, molybdenum-tungsten alloy (MoW)).

Next, the gate insulating layer 13 is formed on the gate electrode 12 (Step S12). Subsequently, the amorphous silicon layer 14 is formed on the gate insulating layer 13 (Step S13).

Figure 5C:
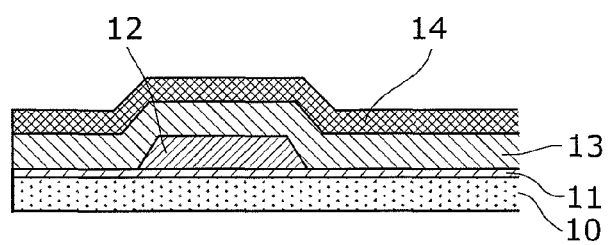
FIG. 5C illustrates a cross-sectional view showing for describing the method of manufacturing the thin-film transistor included in the thin-film transistor array according to the exemplary embodiment of this disclosure.
Figure 6:
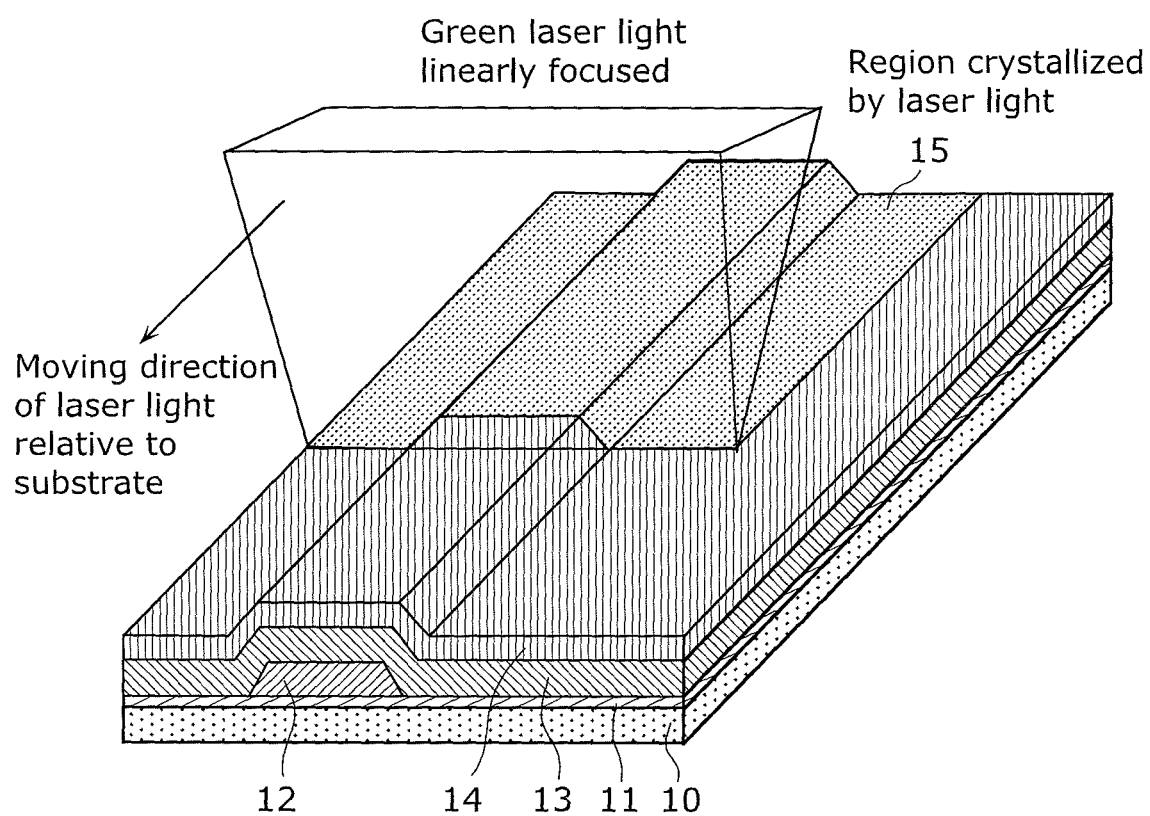
FIG. 6 is a diagram schematically showing laser annealing in Step S14 shown in FIG. 4.

Specifically, the gate insulating layer 13 is formed on the gate electrode 12 by plasma CVD so as to cover the undercoat layer 11 and the gate electrode 12 by forming a silicon oxide film, a silicon nitride film, or stacked films of a silicon oxide film and a silicon nitride film (FIG. 5B), and then a continuous film of an amorphous silicon layer 14 is formed on the gate insulating layer 13 by plasma CVD (FIG. 5C).

Next, the amorphous silicon layer 14 is changed into the crystalline silicon layer 15 by laser annealing (Step S14). Specifically, the amorphous silicon layer 14 is crystallized using laser light emitted from a predetermined laser to generate the crystalline silicon layer 15. More specifically, first the amorphous silicon layer 14 is dehydrogenated. The dehydrogenation is generally performed by heating the amorphous silicon layer 14 at 450° C. or above in a nitrogen atmosphere in a relax oven. Subsequently, the amorphous silicon layer 14 is made polycrystalline (which here includes microcrystalline in its meaning) by laser annealing, so that the crystalline silicon layer (FIG. 5D) is formed.

The laser light source used for laser irradiation in the laser annealing emits laser light having a wavelength within the visible spectrum, as described above. Specifically, the laser light having a wavelength within the visible spectrum is laser light having a wavelength of approximately 380 nanometers to 780 nanometers, and is preferably laser light having a wavelength from 400 nanometers to 600 nanometers. The laser light having a wavelength within the visible spectrum may oscillate in any one of pulsed oscillation mode, continuous wave mode, and quasi-continuous wave mode. The laser which emits laser light having a wavelength within the visible spectrum may include a solid-state laser device or a laser device using a semiconductor laser element. The irradiation energy density of the laser light having a wavelength within the visible spectrum on the amorphous silicon layer 14 has a variation less than approximately 5%.

Figure 5D:
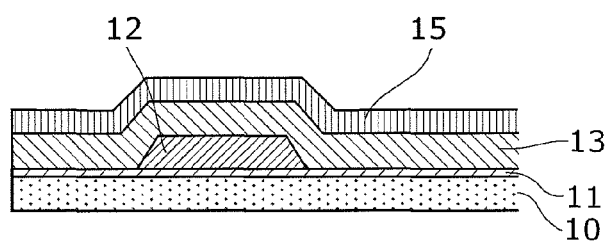
FIG. 5D illustrates a cross-sectional view showing for describing the method of manufacturing the thin-film transistor included in the thin-film transistor array according to the exemplary embodiment of this disclosure.

In Step S14, that is, in the process shown in FIGS. 5C to 5D, the crystalline silicon layer 15 is generated by irradiating the amorphous silicon layer 14 with linearly focused laser light as shown in FIG. 6. There are specifically two methods for laser irradiation: in one method, the laser light is linearly focused on a fixed position, and a stage carrying the substrate 10 where the amorphous silicon layer 14 is formed is moved; in the other method, the stage is fixed, and the position on which the laser light is focused is moved. In either method, the amorphous silicon layer 14 is irradiated while the laser light is moving relative to the amorphous silicon layer 14. The amorphous silicon layer 14 irradiated with the laser light in this manner absorbs energy of the laser light and increases in temperature to crystallize, and consequently becomes the crystalline silicon layer 15.

The laser irradiation may be performed using laser light focused not linearly but so as to form an irradiation spot (for example, a circular or oval spot). In this case, the laser irradiation is preferably performed using a scanning method suitable for crystallization of the amorphous silicon layer 14.

Next, the amorphous silicon layer 16, which is the second amorphous silicon layer, is formed (Step S15), and the silicon layer is patterned to form the channel region of the thin-film transistor 100 (Step S16).

Figure 5E:
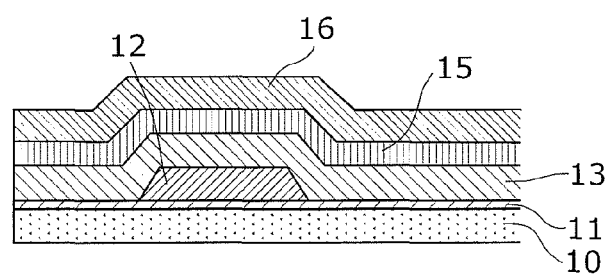
FIG. 5E illustrates a cross-sectional view showing for describing the method of manufacturing the thin-film transistor included in the thin-film transistor array according to the exemplary embodiment of this disclosure.
Figure 5F:
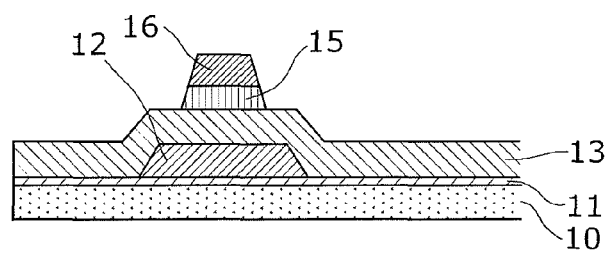
FIG. 5F illustrates a cross-sectional view showing for describing the method of manufacturing the thin-film transistor included in the thin-film transistor array according to the exemplary embodiment of this disclosure.

Specifically, the amorphous silicon layer 16, which is the second amorphous silicon layer, is formed on the gate insulating layer 13 by plasma CVD (FIG. 5E). The silicon films layer (the crystalline silicon layer 15 and the amorphous silicon layer 16) is then patterned so that the channel region of the thin-film transistor 100 will be left behind later, and the amorphous silicon layer 16 and the crystalline silicon layer 15 are etched so that the part to be removed is removed (FIG. 5F). As a result, a desired channel layer is formed in the thin-film transistor 100.

Next, the n+ silicon layer 17 and the source and drain electrodes 18 are formed (Step S17).

Figure 5G:
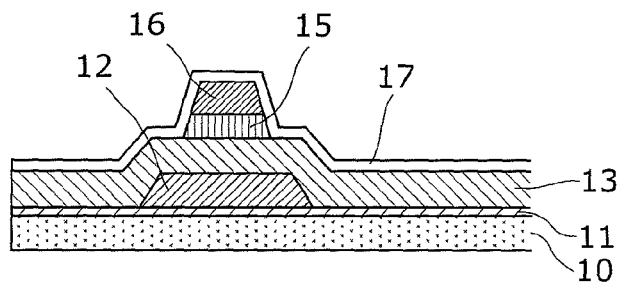
FIG. 5G illustrates a cross-sectional view showing for describing the method of manufacturing the thin-film transistor included in the thin-film transistor array according to the exemplary embodiment of this disclosure.
Figure 5H:
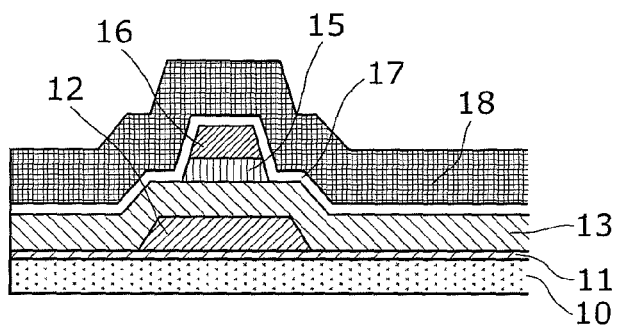
FIG. 5H illustrates a cross-sectional view showing for describing the method of manufacturing the thin-film transistor included in the thin-film transistor array according to the exemplary embodiment of this disclosure.

Specifically, the n+ silicon layer 17 is formed by plasma CVD so as to cover the gate insulating layer 13 and the side surfaces of the amorphous silicon layer 16 and the side surfaces of the crystalline silicon layer 15 (FIG. 5G). The metal to be the source and drain electrodes 18 is then deposited on the n+ silicon layer 17 by sputtering (FIG. 5H). The source and drain electrodes 18 are made of a metal material, such as Mo, a Mo alloy, titanium (Ti), aluminum (Al), an Al alloy, copper (Cu), a Cu alloy, silver (Ag), chromium (Cr), tantalum (Ta), or tungsten (W).

Next, the source and drain electrodes 18 are patterned (Step S18). Subsequently, the n+ silicon layer 17 is etched (Step S19). In the etching, the amorphous silicon layer 16, which is the second amorphous silicon layer, is etched in part (Step S20).

Figure 5I:
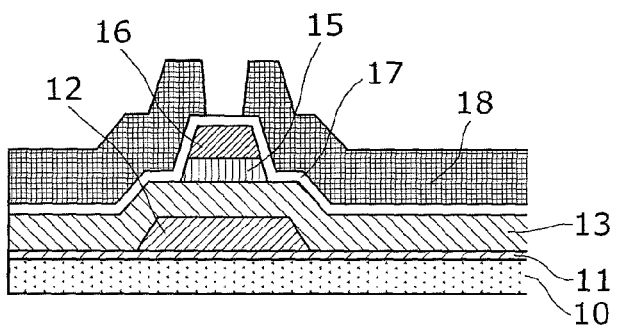
FIG. 5I illustrates a cross-sectional view showing for describing the method of manufacturing the thin-film transistor included in the thin-film transistor array according to the exemplary embodiment of this disclosure.
Figure 5J:
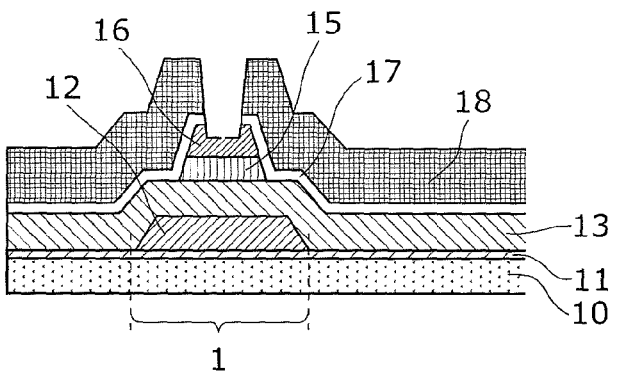
FIG. 5J illustrates a cross-sectional view showing for describing the method of manufacturing the thin-film transistor included in the thin-film transistor array according to the exemplary embodiment of this disclosure.

Specifically, the source and drain electrodes 18 are formed by photolithography and wet-etching (FIG. 5I). The n+ silicon layer 17 is etched, and the amorphous silicon layer 16 in the channel region of the thin-film transistor 100 is etched in part (FIG. 5J). In other words, the amorphous silicon layer 16 is channel-etched so that a part of the amorphous silicon layer 16 in the channel region of the thin-film transistor 100 remains.

The thin-film transistor 100 is manufactured in this manner.

Figure 7:
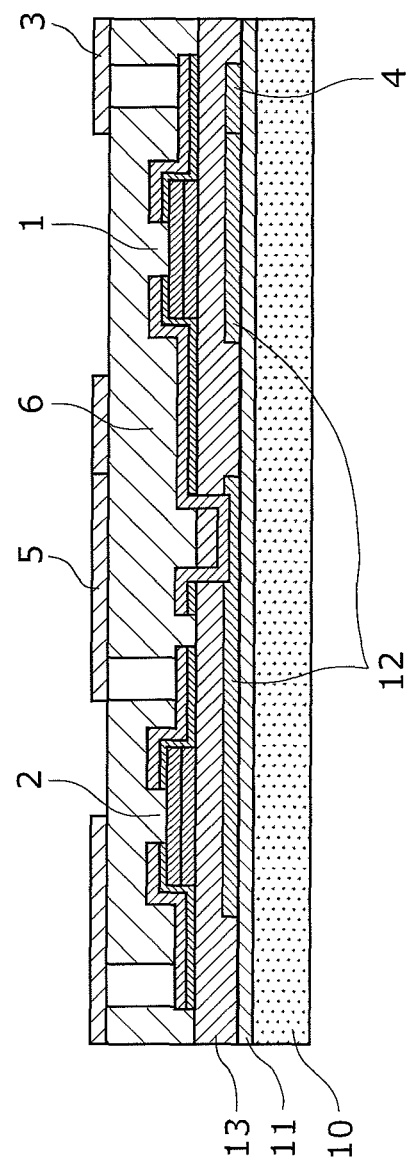
FIG. 7 is a diagram showing an example of a cross-section of a repeating unit cell in the thin-film transistor array according to the exemplary embodiment of this disclosure.

Finally, a process of electrically connecting the thin-film transistors 100 included in the thin-film transistor array shall be briefly described below. FIG. 7 is a diagram showing an example of a cross-section of a repeating unit cell in the thin-film transistor array according to the embodiment of the present invention. Elements in common with FIG. 3 or FIG. 5A to FIG. 5J are denoted by the same reference numerals and thus detailed description thereof is omitted.

As shown in FIG. 7, an interlayer insulation film of silicon nitride for protection and passivation of the thin-film transistor 100 is formed over the surface of the substrate 10 by CVD. Next, a contact hole is opened above the source and drain electrodes 18 by photolithography and dry-etching. Then, a metal thin film mainly including Al or Cu is formed over the surface of the substrate 10 by sputtering, and then the data line 3 and the current supply line 5 are formed by photolithography and wet-etching.

As described above, the thin-film transistor 100 in the present embodiment is formed as a poly-Si TFT having the bottom-gate structure. When the thin-film transistor 100 is manufactured, the gate insulating layer 13 and the amorphous silicon layer 14 are formed to have the thicknesses with which the aforementioned correlations are achieved. Then, the amorphous silicon layer 14 is crystallized by laser annealing using laser light having a wavelength within a visible spectrum, preferably within a range from 400 nanometers to 600 nanometers, so that the amorphous silicon layer 14 becomes the crystalline silicon layer 15. In the crystallization, it is possible to control the crystallinity of the crystalline silicon layer 15 in the channel region where the thin-film transistor is formed, according to the gate capacitance of the gate insulating layer 13. Specifically, the crystalline silicon layer 15 can be formed over the surface of the substrate so that the crystallinity of the crystalline silicon layer 15 has a negative correlation with the gate capacitance of the gate insulating layer 13. In other words, the crystalline silicon layer 15 can be formed over the surface of the substrate so that the average crystal grain size of the crystalline silicon layer 15 above the gate electrodes has a negative correlation with the gate capacitance of the gate insulating layer 13. More specifically, the crystalline silicon layer 15 can be formed over the surface of the substrate so that the half-width of a peak around 520 $cm^{-1}$ of a Raman scattering spectrum of the crystalline silicon layer 15 above the gate electrodes has a positive correlation with the gate capacitance of the gate insulating layer 13.

In the thin-film transistor 100 including the crystalline silicon layer formed in this manner, the drive capability for the gate capacitance according to the thickness of the gate insulating layer 13 is offset by the crystallinity of the crystalline silicon layer 15, that is, the electrical conductivity thereof. It is thus possible to reduce variation in on-state properties between the thin-film transistors 100 each including a gate insulating layer of different capacitance due to its different thickness. Therefore, the on-state properties of the thin-film transistor array including the thin-film transistors 100 distribute uniformly across the thin-film transistor array.

As described above, the gate insulating layer 13 and the amorphous silicon layer 14 are formed to satisfy the aforementioned conditions, and the crystalline silicon layer 15 is formed by crystallizing the amorphous silicon layer 14 using the laser light, and is used as the channel layer of the thin-film transistors. The thin-film transistor array does not cause unevenness in picture representation due to variation in on-state properties caused by variation in the thickness of the layers of structure of the thin-film transistors, and thereby advantageously increases display quality of a larger-size display device provided with the thin-film transistor array including the thin-film transistors.

The following example describes calculation of ranges of the thickness of the gate insulating layer 13 and the amorphous silicon layer 14 with which the advantageous effect of the present embodiment is achieved.

(Example) First, a gate insulating layer and an amorphous silicon layer formed each have thicknesses varied from a targeted thickness.

Specifically, for example, the gate insulating layer 13 and the amorphous silicon layer 14 are each continuously formed above a large number of the gate electrodes 12 above the substrate 10. Let $d_{GI}$ represent the targeted thickness of the gate insulating layer 13, and $d_{a\text{-}Si}$ represent the targeted thickness of the amorphous silicon layer 14. In other words, in the case where, for example, the gate insulating layer 13 and the amorphous silicon layer 14 are formed above the substrate 10 to have the respective targeted thicknesses using a CVD apparatus, the gate insulating layer 13 and the amorphous silicon layer 14 still have thicknesses varied from the respective targeted thicknesses within the surface of the substrate 10.

The variation depends on how a gas current flows or how a standing wave of plasma is formed in the deposition chamber of the CVD apparatus, and it is therefore impossible to preclude the variation. However, it can still be optimized by changing deposition conditions in the CVD apparatus.

In the present example, it is assumed that the thickness is varied from the targeted thickness by up to ±15%. Given that the variation in the thickness within the surface of the substrate is normally distributed with respect to the targeted thickness, the targeted thickness of the gate insulating layer 13 can be considered as the average of the thicknesses of the gate insulating layer 13 within the surface of the substrate, and the targeted thickness of the amorphous silicon layer 14 can be considered as the average of the thicknesses of the amorphous silicon layer 14 within the surface of the substrate.

Let $\Delta d_{GI}$ represent the 15% variation of $d_{GI}$, and $\Delta d_{a\text{-}Si}$ represent the 15% variation of $d_{a\text{-}Si}$. Then, it can be assumed that for the combination of targeted thicknesses of the gate insulating layer 13 and the amorphous silicon layer 14, that is, $(d_{GI}, d_{a\text{-}Si})$, a combination of varied thicknesses with maximum variations $(d_{GI} \pm \Delta d_{GI}, d_{a\text{-}Si} \pm \Delta d_{a\text{-}Si})$ (any combinations of the plus and minus signs included) exists above the substrate with a non-zero probability.

Next, consider absorbance A of the amorphous silicon layer 14 for the combinations of varied thicknesses including the combination of the targeted thicknesses $(d_{GI}, d_{a\text{-}Si})$. The absorbance A is the absorbance of the amorphous silicon layer 14 above the gate electrode 12 for laser light having a wavelength λ. The absorbance A is determined as a function of the thickness of the gate insulating layer 13 and the thickness of the amorphous silicon layer 14, and therefore a unique value of the absorbance A can be obtained for each combination of the targeted thicknesses (and varied thicknesses). In the case where the gate insulating layer 13 includes more than one types of films (for example, a film 131 and a film 132), let $d_{GI1}$ represent the thickness of the film 131 and $d_{GI2}$ represent the thickness of the film 132 and consider the 15% variations of $\Delta d_{GI1}$ and $\Delta d_{GI2}$ for the films 131 and 132, respectively. This is applicable also to the case where the gate insulating layer 13 includes more types of films.

By calculating the absorbance A of the amorphous silicon layer above the gate electrode 12 for the combinations of varied thicknesses $(d_{GI} \pm \Delta d_{GI}, d_{a\text{-}Si} \pm \Delta d_{a\text{-}Si})$ corresponding to the combination of the targeted thicknesses $(d_{GI}, d_{a\text{-}Si})$ (this combination is also counted in the combinations of varied thicknesses), a correlation between the values of absorbance A and the varied thicknesses can be defined. It should be noted that the varied thicknesses of the gate insulating layer 13 can be substituted by varied gate capacitances of the gate insulating layer 13 (represented by $C_{GI} \pm \Delta C_{GI}$). In other words, $(d_{GI} \pm \Delta d_{GI}, d_{a\text{-}Si} \pm \Delta d_{a\text{-}Si})$ can be substituted by $(C_{GI} \pm \Delta C_{GI}, d_{a\text{-}Si} \pm \Delta d_{a\text{-}Si})$, and thereby a correlation between the values of absorbance A and the varied gate capacitances can also be defined. Specifically, there is an equivalence relationship between the range of the thicknesses of the gate insulating layer 13 (specifically, the equivalent oxide thicknesses of the gate insulating layer 13) in which there is a positive correlation between the thicknesses of the gate insulating layer 13 on the gate electrodes 12 and the absorbances of the amorphous silicon layer 14 above the gate electrodes 12 for laser light, and the range of the targeted thicknesses of the gate insulating layer 13 in which there is a negative correlation between the gate capacitances ($C_{GI} \pm \Delta C_{GI}$) and the values of the absorbance A defined by the wavelength λ of the laser light and the combinations of varied thicknesses ($d_{GI} \pm \Delta d_{GI}$, $d_{a-Si} \pm \Delta d_{a-Si}$) (for example, a negative slope of a regression line represents such a negative correlation therebetween).

Furthermore, above the gate electrodes 12, the amorphous silicon layer 14 is formed to have thicknesses within a range in which variation of the light absorbances is moderate for variation of the thicknesses of the amorphous silicon layer 14. This range of thicknesses is equivalent to the range of the targeted thicknesses of the amorphous silicon layer 14 in which there is a high correlation between the values of the defined absorbance A and the gate capacitances ($C_{GI} \pm \Delta C_{GI}$) (for example, R squared of a regression line greater than zero, at least 0.3 indicates such a high correlation).

Based on the above logic, the range of the thicknesses of the gate insulation layer 13 and the range of the thicknesses of the amorphous silicon layer 14 in which the advantageous effect of the present embodiment can be achieved are calculated as follows.

First, combinations of assumed varied thicknesses for the targeted thickness ($d_{GI}$, $d_{a-Si}$) are calculated, and for each of the combinations of the assumed varied thicknesses, a value of the absorbance A of the amorphous silicon layer 14 above the gate electrode for laser light having a wavelength λ is calculated. Then, a correlation between the values of the absorbance A and the varied capacitances obtained from the assumed varied thicknesses is determined. A range of the thicknesses in which a regression line representing the correlation has a negative slope and R squared for the correlation is greater than zero can be determined as the range of the thicknesses (a range of possible targeted thicknesses).

An example shall be described below in which the gate insulating layer 13 is composed of an insulating film 1301 and an insulating film 1302. Specifically, the following will describe a configuration in which the insulating film 1301 formed on the gate electrode 12 and the insulating film 1302 formed on the insulating film 1301 compose the gate insulating layer 13. With the configuration, the absorbance of the amorphous silicon layer 14 above the gate electrode 12 for laser light having a wavelength λ is calculated as follows.

Figure 8:
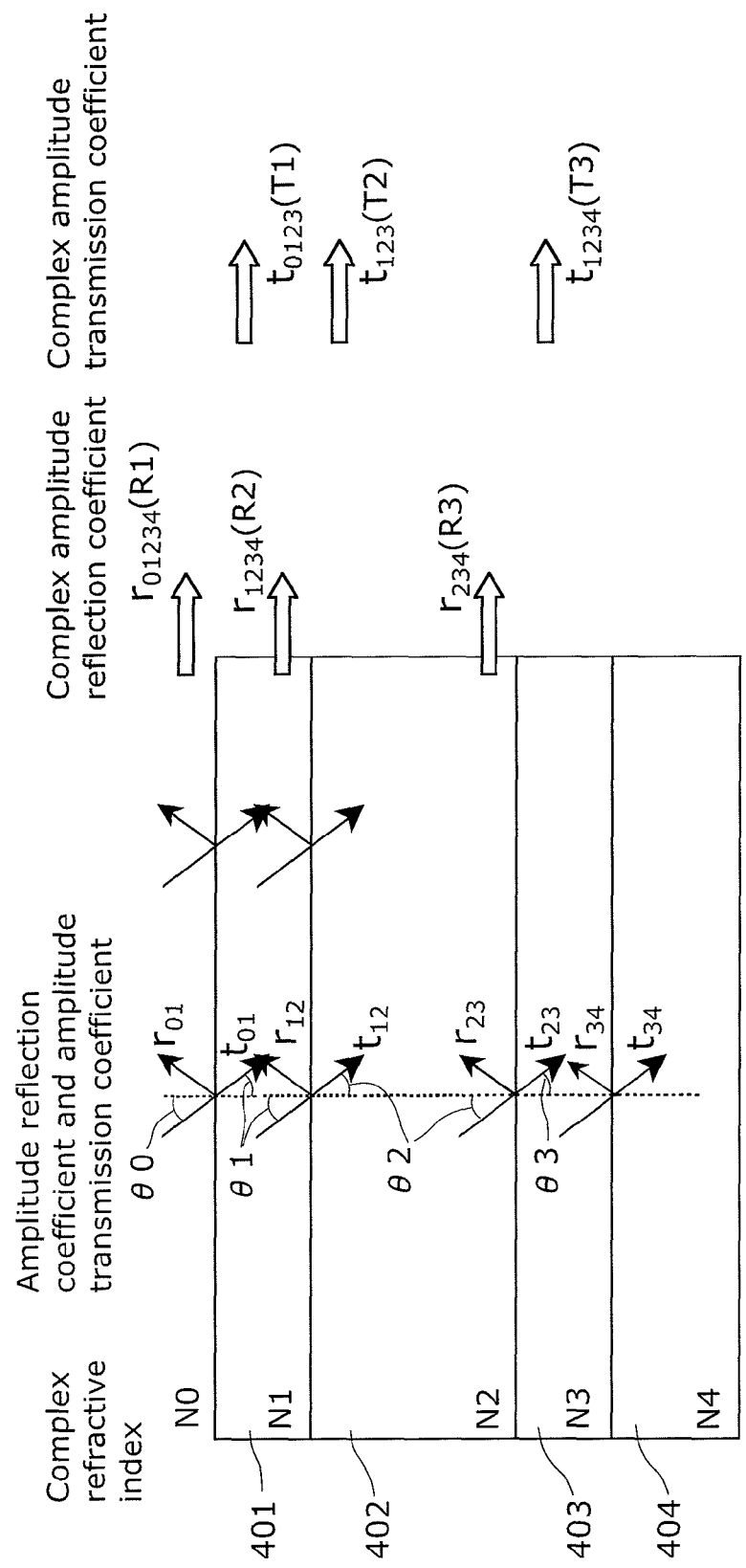
FIG. 8 is a diagram for describing a method of calculating amplitude reflectance and amplitude transmittance.

The light absorbance of the multilayered thin films composing the thin-film transistor 100 is obtained by calculating the amplitude reflectance and amplitude transmittance of each of the films. FIG. 8 is a diagram for describing a method of calculating the amplitude reflectance and amplitude transmittance.

FIG. 8 shows a multilayer model structure that models the structure of the thin-film transistor 100 shown in FIG. 2. The model structure shown in FIG. 8 includes a layer 401 having a complex refractive index N1, a layer 402 having a complex refractive index N2, a layer 403 having a complex refractive index N3, a layer 404 having a complex refractive index N4, and a substrate layer 405 (not shown) having a complex refractive index N5. In this model structure, the layers 404, 403, 402, and 401 are stacked on the substrate layer 405 in this order. A region having a complex refractive index N0 in FIG. 8 is outside the model structure and indicates a side from which laser light enters the model structure. The region is, for example, air or $N_2$ gas.

The substrate layer 405 is an insulating substrate made of, for example, transparent glass or quartz, and corresponds to the substrate 10 shown in FIG. 5A. The layer 404 is composed of a metal thin film having such a thickness that the transmittance to the laser light is 1% or below. It is made of, for example, a refractory metal such as Mo, Cr, or W, and corresponds to the gate electrode 12 shown in FIG. 5A. The layer 403 is composed of the insulating film 1301, and the layer 402 is composed of the insulating film 1302. The insulating film 1301 and the insulating film 1302 are, for example, dielectric thin films made of silicon nitride and silicon oxide, respectively. The stacked films of these two layers (the layers 403 and 404) correspond to the gate insulating layer 13 shown in FIG. 5A. The layer 401 corresponds to the amorphous silicon layer 14. It should be noted that a layer corresponding to the undercoat layer 11 is omitted in this model structure shown in FIG. 8 in order to neglect light transmission by the gate electrode 12.

In FIG. 8, r01 denotes an amplitude reflection coefficient for light entering the layer 401 from outside, r12 denotes an amplitude reflection coefficient for light entering the layer 402 from the layer 401, r23 denotes an amplitude reflection coefficient for light entering the layer 403 from the layer 402, and r34 denotes an amplitude reflection coefficient for light entering the layer 404 from the layer 403. t01 denotes an amplitude transmission coefficient for light entering the layer 401 from outside, t12 denotes an amplitude transmission coefficient for light entering the layer 402 from the layer 401, t23 denotes an amplitude transmission coefficient for light entering the layer 403 from the layer 402, and t34 denotes an amplitude transmission coefficient for light entering the layer 404 from the layer 403.

Furthermore, r01234 (R1), r1234 (R2), and r234 (R3) denote complex amplitude reflection coefficients for the layers above a region where the layer 404 corresponding to the gate electrode 12 is formed. Specifically, r234 (R3) denotes a complex amplitude reflection coefficient for the layers 404 and 403 collectively regarded as a single layer. Likewise, r1234 (R2) denotes a complex amplitude reflection coefficient for the layers 404, 403, and 402 collectively regarded as a single layer, and r01234 (R1) denotes a complex amplitude reflection coefficient for the layers 404, 403, 402, and 401 collectively regarded as a single layer. Furthermore, t01234 (T1), t1234 (T2), and t234 (T3) denote complex amplitude transmission coefficient for the layers in FIG. 8. Specifically, t234 (T3) denotes a complex amplitude transmission coefficient for the layers 404 and 403 collectively regarded as a single layer. Likewise, t1234 (T2) denotes a complex amplitude transmission coefficient for the layers 404, 403, and 402 collectively regarded as a single layer, and t01234 (T1) denotes a complex amplitude transmission coefficient when the layers 404, 403, 402, and 401 collectively regarded as a single layer.

The complex amplitude reflection coefficients and the amplitude transmission coefficients of in the region where the layer 404 corresponding to the gate electrode 12 is formed can be represented by the following (Expression 1) to (Expression 6):

[Math. 1]

$$r_{01234} = \frac{r_{01} + r_{1234}\exp(-i2\beta_1)}{1 + r_{01}r_{1234}\exp(-i2\beta_1)} \quad \text{(Expression 1)}$$

[Math. 2]

$$r_{1234} = \frac{r_{12} + r_{234}\exp(-i2\beta_2)}{1 + r_{12}r_{234}\exp(-i2\beta_2)} \quad \text{(Expression 2)}$$

[Math. 3]

-continued $$r_{234} = \frac{r_{23} + r_{34}\exp(-i2\beta_3)}{1 + r_{23}r_{34}\exp(-i2\beta_3)} \quad \text{(Expression 3)}$$

[Math. 4]

$$t_{01234} = \frac{t_{01}t_{1234}\exp(-i\beta_1)}{1 + r_{01}r_{1234}\exp(-i2\beta_1)} \quad \text{(Expression 4)}$$

[Math. 5]

$$t_{1234} = \frac{t_{12}t_{234}\exp(-i\beta_2)}{1 + r_{12}r_{234}\exp(-i2\beta_2)} \quad \text{(Expression 5)}$$

[Math. 6]

$$t_{234} = \frac{t_{23}t_{34}\exp(-i\beta_3)}{1 + r_{23}r_{34}\exp(-i2\beta_3)} \quad \text{(Expression 6)}$$

where $$\beta_1 = 2\pi d_1 N_1 \cos\theta_1/\lambda, \quad \text{[Math. 7]}$$

$$\beta_2 = 2\pi d_2 N_2 \cos\theta_2/\lambda, \quad \text{[Math. 8]}$$

$$\beta_3 = 2\pi d_3 N_3 \cos\theta_3/\lambda, \quad \text{[Math. 9]}$$

and $d_n$ is the thickness of each layer, $\theta_n$ is the incidence angle or transmission angle for each layer, and $\lambda$ is the wavelength of laser light.

$\theta$ is calculated according to Snell's law shown below.
[Math. 10]

$$N_0 \sin\theta_0 = N_1 \sin\theta_1 = N_2 \sin\theta_2 = N_3 \sin\theta_3 \quad \text{(Expression 7)}$$

The amplitude reflection coefficients r01, r12, r23, and r34 and the amplitude transmission coefficients t01, t12, t23, and t34 of the individual layers can be calculated using the following (Expression 8) to (Expression 15):

[Math. 11]

$$r_{01} = \frac{N_0\cos\theta_1 - N_1\cos\theta_0}{N_0\cos\theta_1 + N_1\cos\theta_0} \quad \text{(Expression 8)}$$

[Math. 12]

$$r_{12} = \frac{N_1\cos\theta_2 - N_2\cos\theta_1}{N_1\cos\theta_2 + N_2\cos\theta_1} \quad \text{(Expression 9)}$$

[Math. 13]

$$r_{23} = \frac{N_2\cos\theta_3 - N_3\cos\theta_2}{N_2\cos\theta_3 + N_3\cos\theta_2} \quad \text{(Expression 10)}$$

[Math. 14]

$$r_{34} = \frac{N_3\cos\theta_4 - N_4\cos\theta_3}{N_3\cos\theta_4 + N_4\cos\theta_3} \quad \text{(Expression 11)}$$

[Math. 15]

$$t_{01} = \frac{2N_0\cos\theta_1}{N_0\cos\theta_1 + N_1\cos\theta_0} \quad \text{(Expression 12)}$$

[Math. 16]

$$t_{12} = \frac{2N_1\cos\theta_2}{N_1\cos\theta_2 + N_2\cos\theta_1} \quad \text{(Expression 13)}$$

[Math. 17]

$$t_{23} = \frac{2N_2\cos\theta_3}{N_2\cos\theta_3 + N_3\cos\theta_2} \quad \text{(Expression 14)}$$

[Math. 18]

$$t_{34} = \frac{2N_3\cos\theta_4}{N_3\cos\theta_4 + N_4\cos\theta_3} \quad \text{(Expression 15)}$$

It is assumed here that the light is monochromatic laser light with p-polarization.

Subsequently, the complex amplitude reflection coefficients and the complex amplitude transmission coefficients in the region where the layer 404 corresponding to the gate electrode 12 is formed are calculated as follows, using the aforementioned expressions. Specifically, first r234 is calculated by substituting (Expression 10) and (Expression 11) into (Expression 3). Next, r1234 is calculated by substituting (Expression 2) and r234 into (Expression 9). Next, r01234 is calculated by substituting (Expression 8) and r1234 into (Expression 3). Next, t234 is calculated by substituting (Expression 10), (Expression 11), (Expression 14), and (Expression 15) into (Expression 6). Next, t1234 is calculated by substituting (Expression 9), (Expression 13), r234, and t234 into (Expression 5). Next, t01234 is calculated by substituting (Expression 8), (Expression 12), r1234, and t1234 into (Expression 4).

Subsequently, the reflectances R1, R2, and R3, and the transmittances T1, T2, and T3 of the respective layers above the region where the layer 404 corresponding to the gate electrode 12 is formed are calculated using the following (Expression 16) to (Expression 21):

[Math. 19]

$$R_1 = |r_{01234}|^2 \quad \text{(Expression 16)}$$

[Math. 20]

$$R_2 = |r_{1234}|^2 \quad \text{(Expression 17)}$$

[Math. 21]

$$R_3 = |r_{234}|^2 \quad \text{(Expression 18)}$$

[Math. 22]

$$T_1 = \left(\frac{Re(N_4)\cos\theta_0}{Re(N_0)\cos\theta_4}\right)|t_{01234}|^2 \quad \text{(Expression 19)}$$

[Math. 23]

$$T_2 = \left(\frac{Re(N_4)\cos\theta_1}{Re(N_1)\cos\theta_4}\right)|t_{1234}|^2 \quad \text{(Expression 20)}$$

[Math. 24]

$$T_3 = \left(\frac{Re(N_4)\cos\theta_2}{Re(N_2)\cos\theta_4}\right)|t_{234}|^2 \quad \text{(Expression 21)}$$

Lastly, the light absorbance A of the amorphous silicon layer above the gate electrode can be calculated using (Expression 22).
[Math. 25]

$$A = 1 - (R_1 + T_1) \quad \text{(Expression 22)}$$

By using the above-described calculation method, the light absorbance of the amorphous silicon layer above the gate electrode can be calculated for the case where the laser light having the wavelength $\lambda$ vertically enters the model structure shown in FIG. 8, that is, at an incident angle $\theta_0$ within a range in which $\theta_0 = 0$ or $\sin\theta_0 = 0$ is approximately satisfied. It should be noted that the calculation result is the same when the laser light is light with s-polarization.

By this method, given that thickness of the amorphous silicon layer 14 is $d_{a\text{-}Si}$, and, for example, the insulating film 1301 and the insulating film 1302 composing the gate insulating layer 13 are a silicon nitride film of the thickness $d_{SiN}$ and a silicon oxide film of the thickness $d_{SiO}$, respectively, the absorbance of the amorphous silicon layer 14 above the gate electrode 12 for laser light can be calculated using the thicknesses $d_{SiN}$ and $d_{SiO}$. Furthermore, in the case where the gate insulating layer 13 is composed of a single-layered insulating film, the absorbance of the amorphous silicon layer 14 above the gate electrode 12 for laser light can be calculated on the basis of assumption that the insulating film 1301 and the insulating film 1302 are made of the same material.

A range of thicknesses of the amorphous silicon layer 14 appropriate for achieving the advantageous effect of the present embodiment shall be described below.

Figure 9:
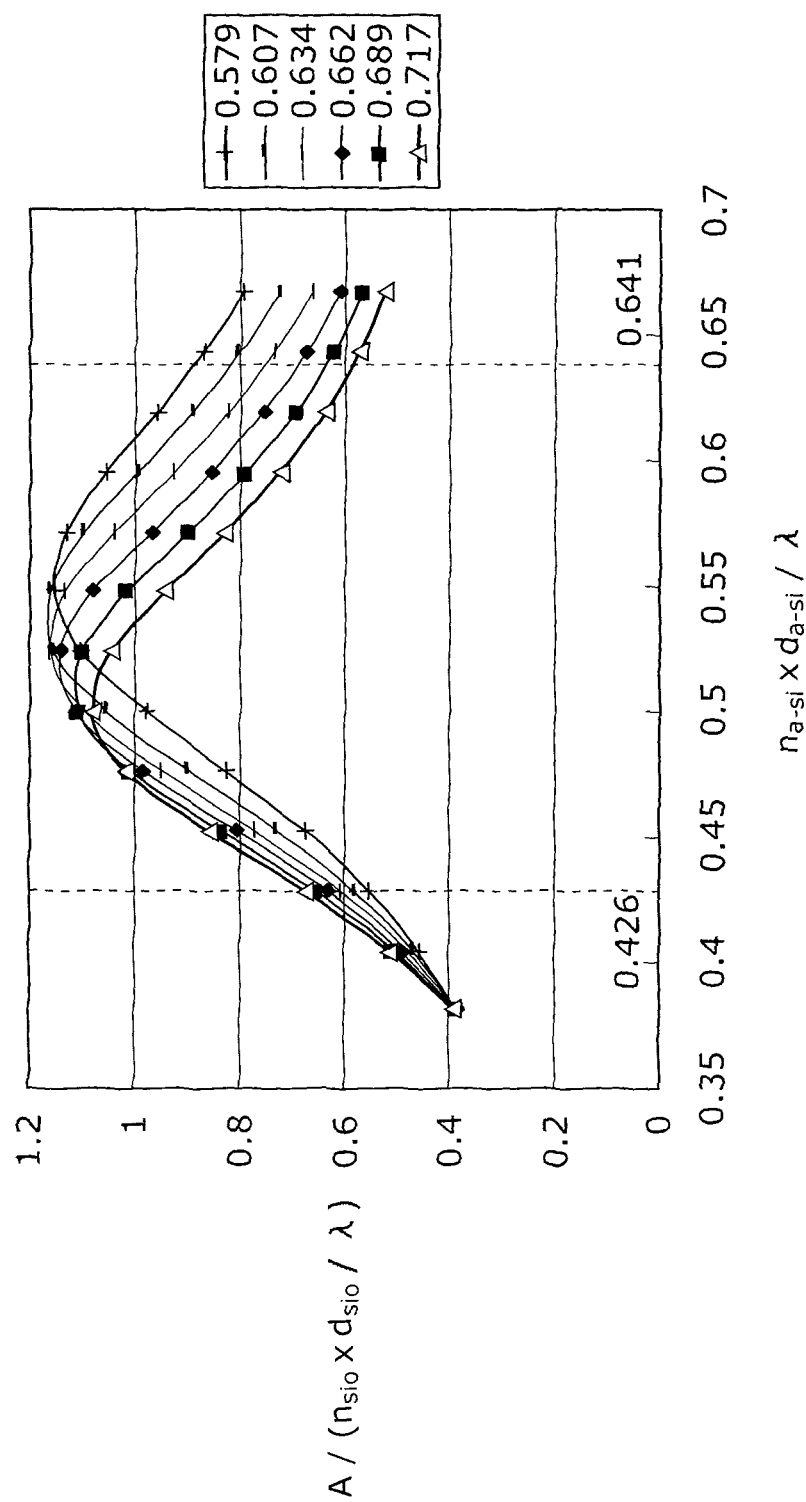
FIG. 9 is a diagram showing that there is a thickness range of an amorphous silicon layer appropriate for forming a crystalline silicon layer by laser annealing crystallization.

FIG. 9 is a diagram showing that there is a range of thicknesses of an amorphous silicon layer appropriate for forming a crystalline silicon layer by laser annealing crystallization.

Specifically, FIG. 9 shows relationships between the optical thicknesses ($n_{a\text{-}Si} \times d_{a\text{-}Si}/\lambda$) and the absorbances ($A/(n_{SiO} \times d_{SiO}/\lambda)$) of the amorphous silicon layer 14 for the laser light having a wavelength $\lambda$ in the case where the gate insulating layer 13 is composed of a single-layer silicon oxide film. The optical thicknesses of the silicon oxide film 14 are normalized to a wavelength $\lambda$ of the laser light. The absorbances are normalized to the thicknesses of the silicon oxide film normalized to the wavelength $\lambda$ of the laser light. Each of the curves shown in FIG. 9 connects a set of values for one of the optical thicknesses ($n_{SiO} \times d_{SiO}/\lambda$) of the silicon oxide film normalized to the wavelength $\lambda$ of the laser light. The relationships shown in FIG. 9 are obtained using the above-described process of calculating the absorbance of the amorphous silicon layer 14 above the gate electrodes 12 for laser light of a wavelength from 400 nanometers to 600 nanometers.

As shown in FIG. 9, the optical thicknesses ($n_{a\text{-}Si} \times d_{a\text{-}Si}/\lambda$) at which the curves have local maxima vary depending on the optical thicknesses ($n_{SiO} \times d_{SiO}/\lambda$) of the silicon oxide film.

In order to provide the thin-film transistors 100 in a thin-film transistor array with uniform on-state properties, it is necessary to prevent the variation of the thicknesses of the amorphous silicon layer 14 from affecting variation of the absorbances of the amorphous silicon layer 14 above the gate electrodes. For this purpose, in the present example, the amorphous silicon layer 14 needs to be formed to have thicknesses within a range in which the variation of the thicknesses of the amorphous silicon layer 14 has less impact on the absorbances of the amorphous silicon layer 14 above the gate electrodes.

The range of thicknesses in which the variation of the thicknesses of the amorphous silicon layer 14 has less impact on variation of the absorbances of the amorphous silicon layer 14 above the gate electrodes corresponds to the range of the thicknesses of the amorphous silicon layer 14 around the optical thicknesses ($n_{a\text{-}Si} \times d_{a\text{-}Si}/\lambda$) at which the curves of all the optical thicknesses ($n_{SiO} \times d_{SiO}/\lambda$) have local maxima as shown in FIG. 9. In other words, the range of appropriate thicknesses of the amorphous silicon layer 14 is a range corresponding to the thicknesses within a certain range from the thicknesses at which the curves of all the optical thicknesses ($n_{SiO} \times d_{SiO}/\lambda$) have local maxima. Specifically, the amorphous silicon layer 14 is formed to have appropriate thicknesses which falls within a range in which the derivative of $A/(n_{SiO} \times d_{SiO}/A)$ differentiated with respect to $n_{a\text{-}Si} \times d_{a\text{-}Si}/\lambda$ ranges within, for example, −5 to +5 from an optical thickness ($n_{a\text{-}Si} \times d_{a\text{-}Si}/\lambda$) at which the derivative is zero (that is, $A/(n_{SiO} \times d_{SiO}/\lambda$ reaches a maximum).

The range of the thicknesses corresponding to the derivatives from −5 to +5 can be specifically represented by Expression 23.

$$0.426 \leq n_{a\text{-}Si} \times d_{a\text{-}Si}/\lambda \leq 0.641 \quad \text{(Expression 23)}$$

It should be noted that the gate insulating layer 13 does not absorb laser light as long as the insulating film composing the gate insulating layer 13 is transparent to the laser light, that is, the extinction coefficient of the insulating film composing the gate insulating layer 13 is small enough (0.01 or below) not to have an impact on multiple interference of the laser light. Therefore, the range of appropriate thicknesses of the amorphous silicon layer 14 is effective regardless of the configuration of the gate insulating layer 13.

Furthermore, although the gate insulating layer 13 described in the present example is composed of a single-layer silicon oxide film for simplicity, the gate insulating layer 13 may be configured otherwise. As long as the gate insulating layer 13 is composed of a transparent insulating film, the same result can be obtained by replacing the optical thickness of the silicon oxide layer in the above calculation with the optical thickness of the transparent insulating films (the sum of products of the refractive index and the thickness of the respective insulating films).

A range of appropriate thicknesses of the amorphous silicon layer 14 for achieving the advantageous effect of the present embodiment shall be described more specifically below. In what follows, it is assumed that the laser light is of a wavelength from 400 nanometers to 600 nanometers, and the range of $n_{a\text{-}Si} \times d_{a\text{-}Si}/\lambda$ is from 0.426 to 0.641. It is also assumed that the insulating film 1301 and the insulating film 1302 composing the gate insulating layer 13 are respectively a silicon nitride film and a silicon oxide film for example.

In this case, the gate capacitance $C_{GI}$ of the gate insulating layer 13, which is the total capacitance of the capacitance of the silicon oxide film and the capacitance of the silicon nitride film, can be calculated by Expression 24, where the $\varepsilon_{SiO}$ denotes relative permittivity of the silicon oxide film, $\varepsilon_{SiN}$ denotes the relative permittivity of the silicon nitride film, and $\varepsilon_0$ denotes permittivity of vacuum.

[Math. 26]

$$C_{GI} = \frac{\varepsilon_0 \varepsilon_{SiO} \varepsilon_{SiN}}{d_{SiO} \varepsilon_{SiN} + d_{SiN} \varepsilon_{SiO}} \quad \text{(Expression 24)}$$

In addition, the gate capacitance used hereinafter for determining the correlation between the gate capacitance $C_{GI}$ and the absorbance A is a gate capacitance $C_{GI}' = (C_{GI} \pm \Delta C_{GI})/C_{GI}$ which is the gate capacitance of the gate insulating layer 13 with variation, normalized to the gate capacitance $C_{GI}$ of the targeted thickness of the gate insulating layer 13.

First, the correlation between the absorbance A of the amorphous silicon layer 14 above the gate electrode and the normalized gate capacitance $C_{GI}'$ is determined for the combinations of varied thicknesses ($d_{a\text{-}Si} \pm \Delta d_{a\text{-}Si}$, $d_{SiO} \pm \Delta d_{SiO}$, $d_{SiN} \pm \Delta d_{SiN}$) (any combinations of the plus and minus signs included) using the aforementioned expressions. The varied thicknesses in the combinations of ($d_{a\text{-}Si} \pm \Delta d_{a\text{-}Si}$, $d_{SiO} \pm \Delta d_{SiO}$, $d_{SiN} \pm \Delta d_{SiN}$) (any combinations of the plus and minus signs included) are thicknesses which may vary from the targeted thicknesses ($d_{a\text{-}Si}$, $d_{SiO}$, $d_{SiN}$) up to ±15%, and the laser light has a wavelength $\lambda$.

Next, the determined correlations are plotted, and the coefficient of the regression line and R squared for the plotted correlations are calculated for each of the targeted thicknesses.

Figure 10A:
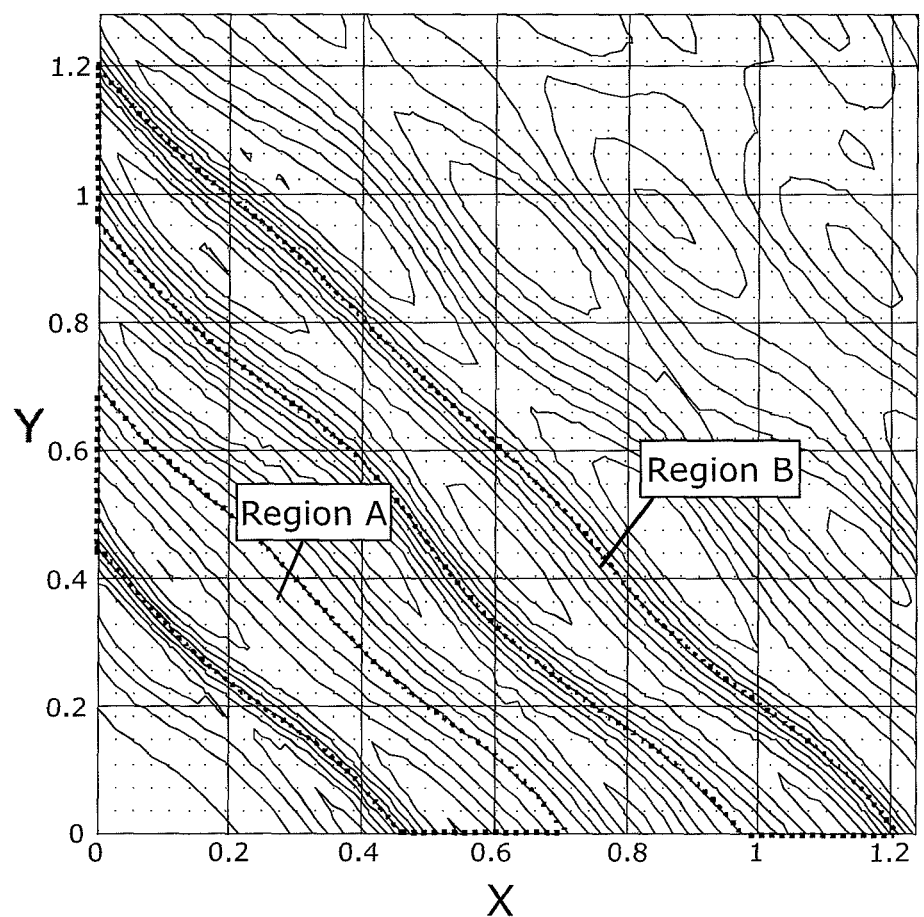
FIG. 10A is a diagram showing that there are thickness ranges of insulating films forming the gate insulation layer suitable for forming the crystalline silicon layer by laser annealing crystallization.

FIG. 10A is a diagram showing ranges of appropriate thicknesses of the insulating films composing the gate insulation layer 13 for forming the crystalline silicon layer 15 by laser annealing crystallization.

Figure 10B:
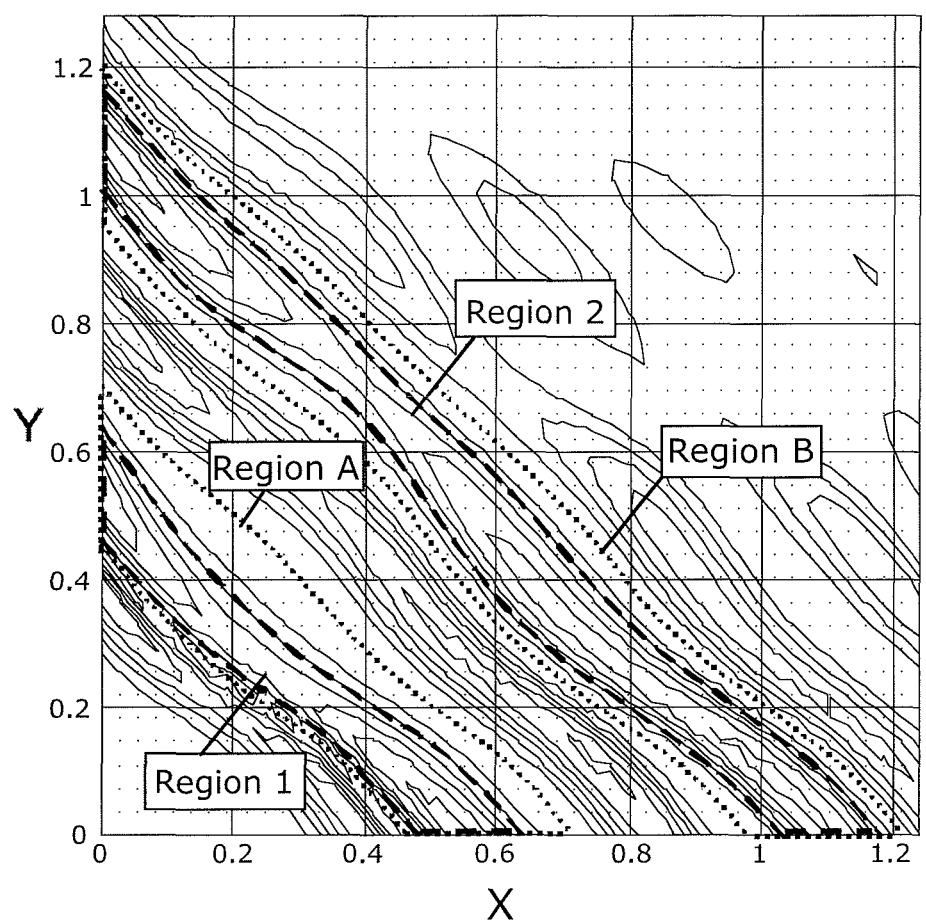
FIG. 10B is a diagram showing that there are thickness ranges of insulating films forming the gate insulation layer suitable for forming the crystalline silicon layer by laser annealing crystallization.

Specifically, FIG. 10A illustrates the coefficients of the regression lines representing the correlations between the absorbance A and the normalized gate capacitance $C_{GI}'$ as a contour diagram. FIG. 10B is a diagram showing ranges of thicknesses of the insulating films composing the gate insulation appropriate layer 13 for forming the crystalline silicon layer 15 by laser annealing crystallization. Specifically, FIG. 10B illustrates the values of R squared of the regression lines for the correlations between the absorbance A and the normalized gate capacitance $C_{GI}'$ as a contour diagram. In FIG. 10A and FIG. 10B, the horizontal axes X represent optical thickness of the silicon oxide layer, that is, the quotient of the division of the product of the refractive index $n_{SiO}$ of the silicon oxide layer and the thickness of the silicon oxide layer $d_{SiO}$ by the wavelength $\lambda$ of the laser light, that is, $X=(n_{SiO}\times d_{SiO})/\lambda$. The vertical axes Y represent the quotient of the division of the product of the refractive index $n_{SiN}$ of the silicon nitride layer and the thickness of the silicon nitride layer $d_{SiN}$ by the wavelength $\lambda$ of the laser light, that is, $X=(n_{SiN}\times d_{SiN})/\lambda$. In other words, the values shown in FIG. 10A and FIG. 10B are generalized to the wavelength of the laser light and the optical constant of the gate insulating layer 13. In addition, the optical constants of the material for the gate electrode 12, specifically, the refractive index n and the extinction coefficient k affect the absolute values of the absorbance A of the amorphous silicon layer 14 above the gate electrode 12 but not affects the correlation of the absorbance A with the normalized gate capacitance $C_{GI}'$. In other words, the values shown in FIG. 10A and FIG. 10B are generalized also to the material for the gate electrode 12.

The region A and the region B shown in FIG. 10A are the regions where the coefficient of the regression line representing the correlation between the absorbance A and the normalized gate capacitance $C_{GI}'$ is negative. Specifically, the region A is represented by (Expression 25) and (Expression 26), and the region B is represented by (Expression 27) and (Expression 28).

$$Y \geq -1070X^6+1400X^5-688X^4+153X^3-12.90X^2-1.02X+0.439 \quad \text{(Expression 25)}$$

$$Y \leq 49.9X^6-131X^5+127X^4-56.8X^3+11.8X^2-2.01X+0.736 \quad \text{(Expression 26)}$$

$$Y \geq -7.34X^6+8.48X^5+8.65X^4-16.0X^3+7.24X^2-2.04X+0.961 \quad \text{(Expression 27)}$$

$$Y \leq -3.75X^6+11.8X^5-13.1X^4+6.09X^3-1.12X^2-0.87X+1.20 \quad \text{(Expression 28)}$$

Accordingly, when a silicon oxide film and a silicon nitride are formed using, as target thicknesses, thicknesses respectively satisfying (Expression 25) and (Expression 26) or respectively satisfying (Expression 27) and (Expression 28), it is possible to form the gate insulating layer 13 so that there is a negative correlation between the values of the absorbance A of the amorphous silicon layer 14 above the gate electrodes 12 and the gate capacitances of the gate electrodes 12 even when the thickness of the films are varied within the surface of the substrate.

Furthermore, the region 1 and the region 2 shown in FIG. 10B are the regions where R squared of the regression line representing the correlation between the absorbance A and the normalized gate capacitance $C_{GI}'$ is 0.3 or above. Specifically, the region 1 is represented by (Expression 29) and (Expression 30), and the region 2 is represented by (Expression 31) and (Expression 32).

$$Y \geq -132.6X^6+181X^5-93.8X^4+21.3X^3-1.33X^2-1.04X+0.473 \quad \text{(Expression 29)}$$

$$Y \leq 23.7X^6-4.56X^5-35.4X^4+27.2X^3-5.75X^2-0.973X+0.619 \quad \text{(Expression 30)}$$

$$Y \geq 7.46X^6-32.4X^5+50.8X^4-35.7X^3+11.0X^2-2.20X+1.04 \quad \text{(Expression 31)}$$

$$Y \leq -5.34X^6+16.7X^5-18.7X^4+9.18X^3-1.96X^2-0.821X+1.13 \quad \text{(Expression 32)}$$

Accordingly, when a silicon oxide film and a silicon nitride film are formed using, as targeted thickness, thicknesses respectively satisfying (Expression 29) and (Expression 30), or respectively satisfying (Expression 31) and (Expression 32), it is possible to minimize impact of variation in the thickness of the amorphous silicon layer 14 within the substrate on variation in the absorbance A of the amorphous silicon layer 14 above the gate electrodes 12.

Furthermore, FIG. 10B shows the region A and the region B calculated as shown in FIG. 10A. The region 1 and the region 2 are included in the region A and the region B, respectively, as shown in FIG. 10B.

This means that thicknesses of the silicon oxide film and the silicon nitride film are naturally within the ranges of the region A and the region B, respectively when the thicknesses of the silicon oxide film and the silicon nitride film satisfying the expressions representing region 1 and region 2 are used as targeted thicknesses. It is therefore possible to form the gate insulating layer 13 so that there is a negative correlation between the values of the absorbance A of the amorphous silicon layer 14 above the gate electrodes 12 and the gate capacitances of the gate electrodes 12 even when the thickness of any of the silicon oxide film, the silicon nitride film, and the amorphous silicon film is varied within the surface of the substrate.

As described above, the region 1 and the region 2 are the ranges of the target thicknesses of the gate insulating layer 13 and the amorphous silicon layer 14, respectively, most appropriate for achieving the advantageous effect of the present embodiment.

The stacking order of the silicon oxide film and the silicon nitride film in the gate insulating layer 13 is not limited to the order described above. For example, in the case where the silicon nitride film and the silicon oxide film are stacked in the gate insulating layer 13 in reverse order, a range of thicknesses can be obtained using the expressions with X and Y interchanged.

Furthermore, the gate insulating layer 13 may be formed as a single layer. In this case, a range of targeted thicknesses of the gate insulating layer 13 can be obtained using the same calculation method as described above so that there is a negative correlation between the values of the absorbance A of the amorphous silicon layer 14 above the gate electrodes 12 and the gate capacitances of the gate electrodes 12.

Specifically, the value of zero is substituted into X in (Expression 25), (Expression 26), (Expression 27), and (Expression 28). Then, (Expression 33) or (Expression 34) shown below are induced which represents the range of targeted thicknesses of the gate insulating layer 13 generalized to the wavelength λ when the gate insulating layer 13 is formed as a single layer.

$$0.44 \leq n_{GI} \times d_{GI}/\lambda \leq 0.74 \quad \text{(Expression 33)}$$

$$0.96 \leq n_{GI} \times d_{GI}/\lambda \leq 1.20 \quad \text{(Expression 34)}$$

Here, $d_{GI}$ denotes the average of the thicknesses of the gate insulating layer, λ denotes the wavelength of laser light, $n_{GI}$ denotes a refractive index of the laser light having the wavelength λ in the gate insulating layer 13.

Furthermore, the value of zero is also substituted into X in (Expression 29), (Expression 30), (Expression 31), and (Expression 32). Then, (Expression 35) or (Expression 36) shown below are induced which represents the range of targeted thicknesses of the gate insulating layer 13 generalized to the wavelength λ when the gate insulating layer 13 is formed as a single layer.

It is therefore possible to form the gate insulating layer 13 as a single layer having the thickness within the range so that there is a negative correlation between the values of the absorbance A of the amorphous silicon layer 14 above the gate electrodes 12 and the gate capacitances of the gate electrodes 12 even when the thickness of any of the gate insulating layer 13 and the amorphous silicon film 14 is varied within the surface of the substrate. In other words, the range of the thicknesses represented by (Expression 35) or (Expression 36) is the range of targeted thicknesses of the gate insulating layer 13 most appropriate for achieving the advantageous effect of the present embodiment.

$$0.47 \leq n_{GI} \times d_{GI}/\lambda \leq 0.62 \quad \text{(Expression 35)}$$

$$1.04 \leq n_{GI} \times d_{GI}/\lambda \leq 1.13 \quad \text{(Expression 36)}$$

The thicknesses of the amorphous silicon layer 14 and the gate insulating layer 13 are thus obtained which produce the advantageous effect of the present embodiment for both of the cases where the gate insulating layer 13 in the thin-film transistor 100 is of a multi-layer structure and where the gate insulating layer 13 in the thin-film transistor 100 is of a single-layer structure. It should be noted that this method of obtaining the range of thicknesses is applicable not only to the gate insulating layer 13 of a multi-layer structure or a single-layer structure. In other words, this method can be used for obtaining the thicknesses of the amorphous silicon layer 14 and the gate insulating layer 13 regardless of the structure of the gate insulating layer 13 so that the advantageous effect of the present embodiment can be produced.

A specific example shall be given below in which a thin-film transistor array includes a gate insulating layer 13 composed of a silicon nitride film and a silicon oxide film. In the thin-film transistor array, the gate insulating layer 13 is structured by stacking the silicon nitride film on the gate electrode 12 and then stacking the silicon oxide film on the silicon nitride film. It is assumed in the example that the crystalline silicon layer 15 is formed by laser annealing an amorphous silicon layer 14 using laser light having a wavelength λ of 532 nanometers.

Figure 11:
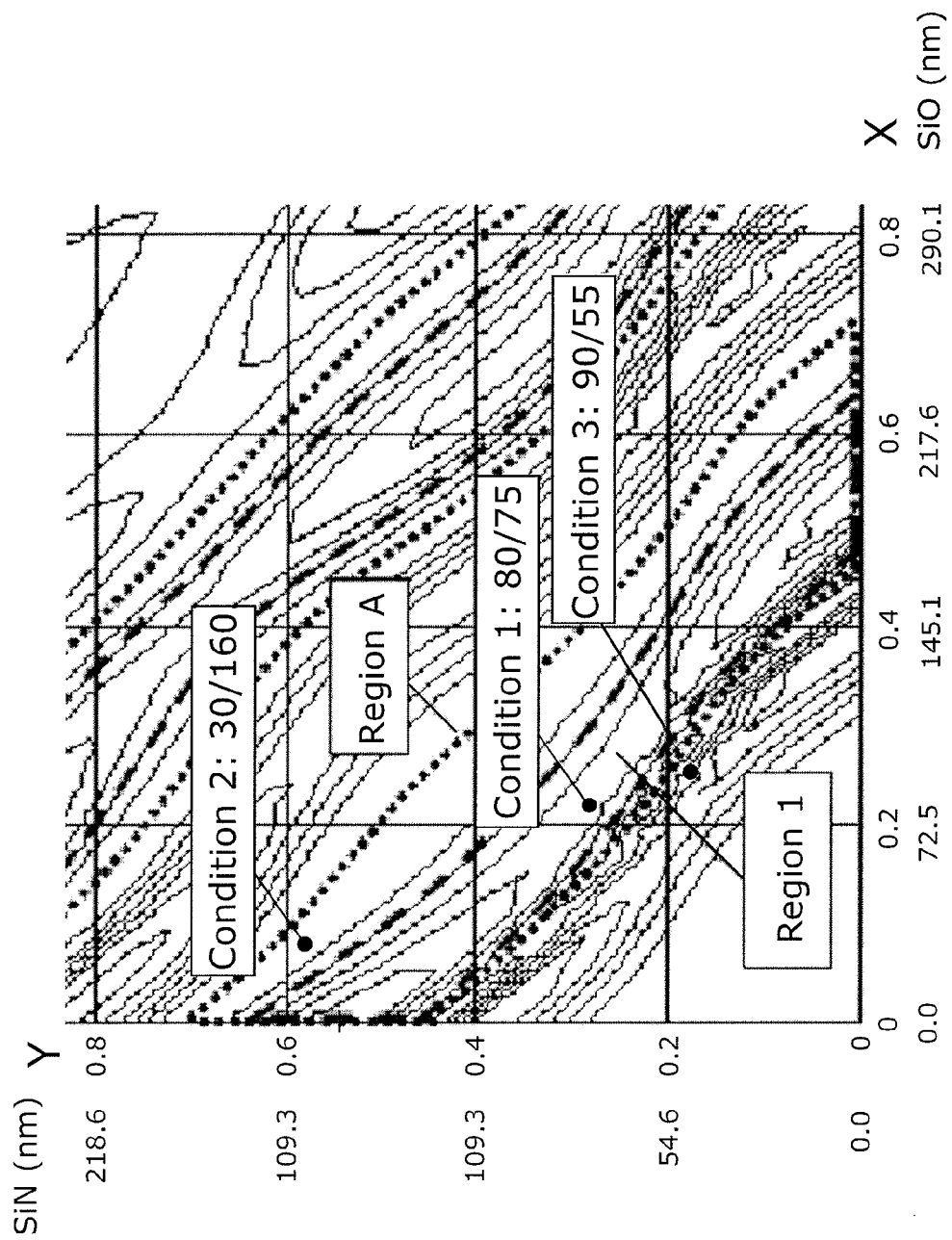
FIG. 11 is a diagram showing a specific example of the thickness ranges of the insulating films forming the gate insulation layer suitable for forming the crystalline silicon layer by laser annealing crystallization.

FIG. 11 is a diagram showing a specific example of thickness ranges of the insulating films forming the gate insulation layer 13 appropriate in the case where the crystalline silicon layer 15 is formed by laser annealing crystallization. Specifically, FIG. 11 shows a scaled view of the range from 0 to 0.8 in X and Y in FIG. 10B using the X values and the Y values converted into actual thicknesses of the silicon oxide film and the silicon nitride film, respectively. It is assumed that the refractive index of the silicon oxide film is 1.467, the refractive index of the silicon nitride film is 1.947, the refractive index of the amorphous silicon layer 14 is 5.07, and the extinction coefficient of the amorphous silicon layer 14 is 0.61. It is also assumed that the range of targeted thicknesses of the amorphous silicon layer 14 is from 44.7 nanometers to 67.3 nanometers, which is obtained using above-described (Expression 23) to (Expression 32).

Here, the inventors examined three conditions (Condition 1 to Condition 3) for the configuration of the gate insulating layer 13 in the structure of the thin-film transistors 100 included in the thin-film transistor array. As shown in FIG. 11, Condition 1 is that the thickness $d_{SiO}$ of the silicon oxide film is 80 nanometers, and the thickness $d_{SiN}$ of the silicon nitride film is 75 nanometers (hereinafter represented as $d_{SiO}/d_{SiN}$=80/75 (nm)). Condition 2 is $d_{SiO}/d_{SiN}$=30/160 (nm). Condition 3 is $d_{SiO}/d_{SiN}$=90/55 (nm).

Condition 1 to Condition 3, that is, the conditions for the configuration of the gate insulating layer 13 are determined so that the equivalent oxide thickness thereof is approximately 120 nanometers.

As can be seen from FIG. 11, the thicknesses in accordance with Condition 1 are included in the region 1, which is most appropriate, and the thicknesses in accordance with the Condition 2 are included at least in the region A. On the other hand, thicknesses in accordance with the Condition 3 are included neither in the region 1 nor the region A. Therefore, among Condition 1 to Condition 3, Condition 1 is the most appropriate condition, and Condition 2 is an appropriate condition. Condition 3 is a conventional condition, which is inappropriate.

Figure 12A:
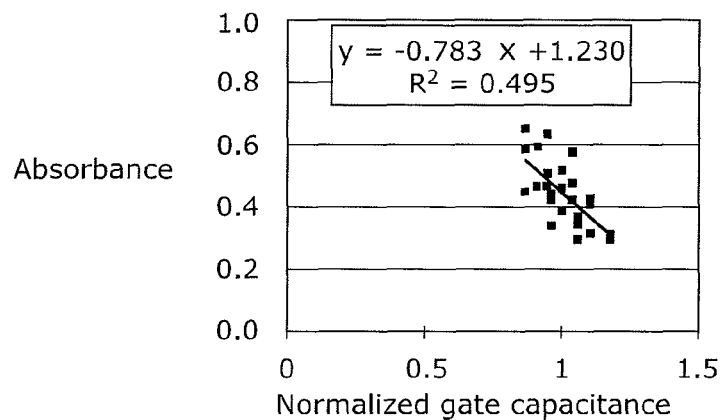
FIG. 12A shows a relationship between the capacitance of a gate insulating layer formed under Condition 1 and having varied thicknesses and the absorbances of an amorphous silicon layer.
Figure 12B:
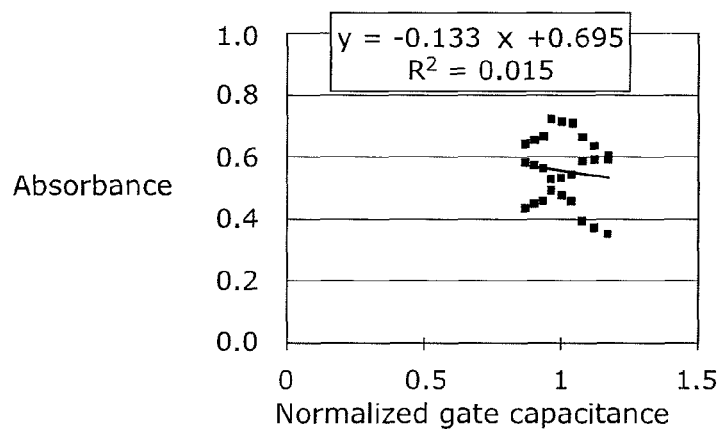
FIG. 12B shows a relationship between the capacitance of a gate insulating layer formed under Condition 2 and having varied thicknesses and the absorbances of an amorphous silicon layer.
Figure 12C:
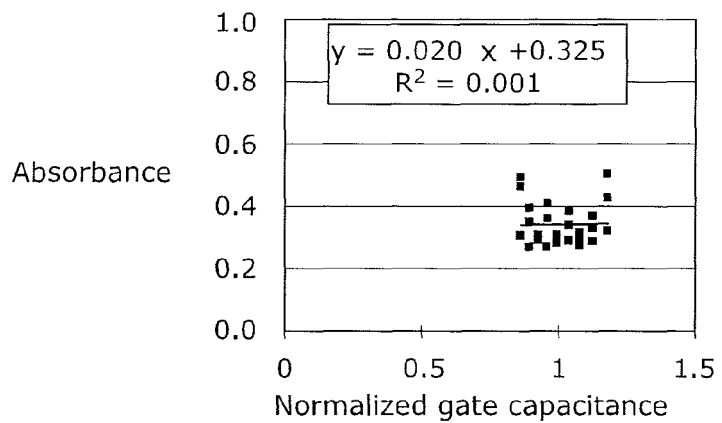
FIG. 12C shows a relationship between the capacitance of a gate insulating layer formed under Condition 3 and having varied thicknesses and the absorbances of an amorphous silicon layer.

FIG. 12A to FIG. 12C show relationships between the capacitance of the layer having varied thicknesses and the absorbances of the amorphous silicon layer 14.

Specifically, FIG. 12A shows a correlation between the absorbances of the amorphous silicon layer 14 above the gate electrodes 12 for laser light and the gate capacitances of the gate insulating layer 13 which is formed using a target thickness conforming to Condition 1 and has thicknesses which may vary from the targeted thickness by up to ±15%. The horizontal axis in FIG. 12A represents normalized gate capacitance which is normalized to the gate capacitance of the gate insulating layer 13 having the targeted thickness, and the vertical axis represents the absorbance. The targeted thickness of the amorphous silicon layer 14 is set at 60 nanometers.

Likewise, FIG. 12B shows the case where the gate insulating layer 13 is formed using a target thickness conforming to Condition 2, and FIG. 12C shows the case where the gate insulating layer 13 is formed using a target thickness conforming to Condition 3.

As can be seen from FIG. 12A to FIG. 12C, there is a highly negative correlation between the gate capacitances and the absorbances of the amorphous silicon layer 14 above the gate electrodes when the targeted thickness is included in the region 1, conforming to Condition 1. At the same time, R squared approximates 0.5, showing that the variation of the thicknesses of the amorphous silicon layer 14 has less impact on variation of the absorbances. On the other hand, when the targeted thickness is not included in the region 1 but at least in the region A, conforming to Condition 2, there is still a weak negative correlation between the gate capacitances and the absorbances of the amorphous silicon layer 14 above the gate electrodes 12, but R squared is as small as 0.1 or below, which shows that variation of the thicknesses of the amorphous silicon layer 14 has a large impact on variation of its absorbances.

Compared to this, when the targeted thickness is included neither in the region 1 nor the region A, conforming to Condition 3, the slope of the regression line representing the correlation between the gate capacitances and the absorbances of the amorphous silicon layer 14 above the gate electrodes 12 is approximately zero. This shows that the absorbances of the amorphous silicon layer 14 above the gate electrodes 12 are not varied in relation to variations of the thicknesses of the gate insulating layer 13, which is an example of the conditions of the thickness in the conventional technique, as disclosed in the Patent Reference 2, for example. Furthermore, R squared is approximately zero, showing that variation of the thicknesses of the amorphous silicon layer 14 has a large impact on variation of the absorbances.

Figure 13A:
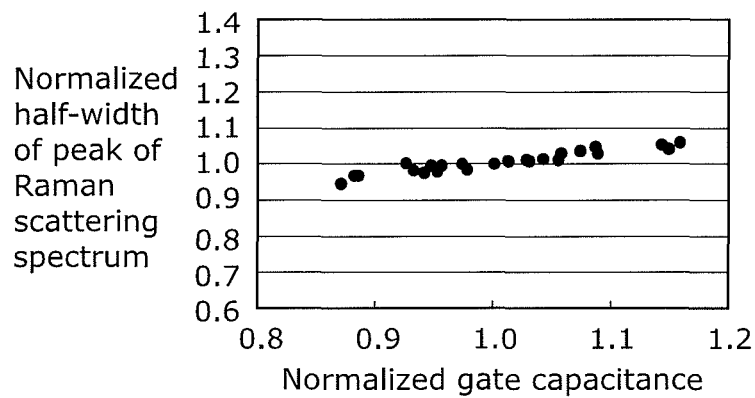
FIG. 13A shows a relationship between the capacitance of a gate insulating layer formed under Condition 1 and having varied thicknesses and the crystallinity of an amorphous silicon layer.
Figure 13B:
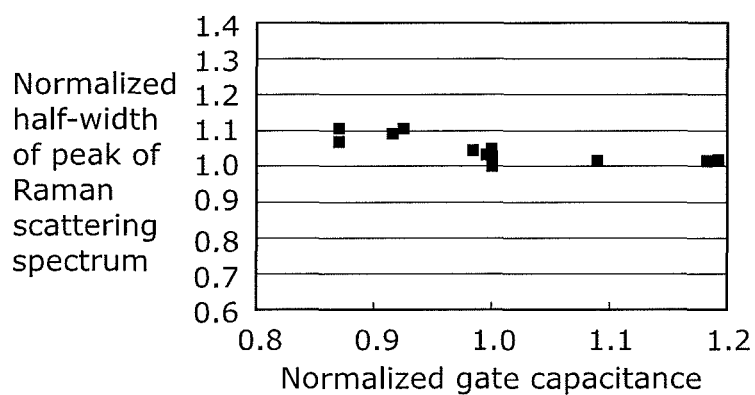
FIG. 13B shows a relationship between the capacitance of a gate insulating layer formed under Condition 2 and having varied thicknesses and the crystallinity of an amorphous silicon layer.
Figure 13C:
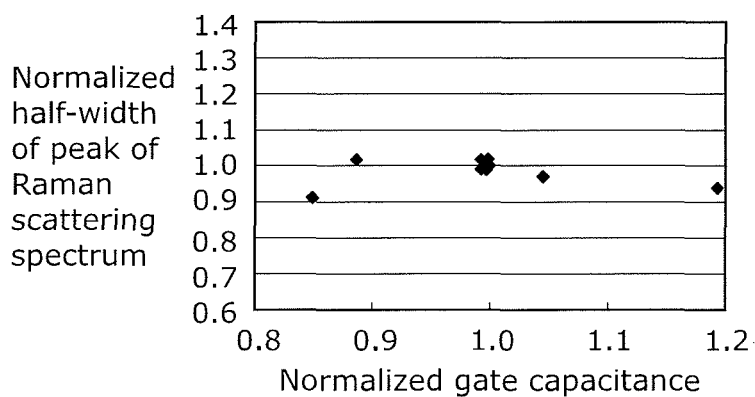
FIG. 13C shows a relationship between the capacitance of a gate insulating layer formed under Condition 3 and having varied thicknesses and the crystallinity of an amorphous silicon layer.

FIG. 13A to FIG. 13C show relationships between the capacitance of the film having varied thicknesses and the crystallinity of the amorphous silicon layer 14.

Specifically, FIG. 13A shows a correlation between the half-width of a peak around 520 cm$^{-1}$ of a Raman scattering spectrum of the crystalline silicon layer 14 above the gate electrodes 12 and the gate capacitance of the gate insulating layer 13 which is formed using a target thickness conforming to Condition 1 and has thicknesses which may vary from the targeted thickness by up to ±15%. The horizontal axis in FIG. 13A represents normalized gate capacitance which is normalized to the gate capacitance of the gate insulating layer 13 having the targeted thickness, and the vertical axis represents the half-width of the peak of the Raman scattering spectrum normalized to the crystalline silicon layer 15 having the targeted thickness.

Likewise, FIG. 13B shows the case where the gate insulating layer 13 is formed using a target thickness conforming to Condition 2, and FIG. 13C shows the case where the gate insulating layer 13 is formed using a target thickness conforming to Condition 3.

Increase in the half-width indicates degradation in crystallinity of the crystalline silicon layer 15. In contrast, decrease in the half-width indicates improvement in crystallinity of the crystalline silicon layer 15.

Accordingly, as can be seen from FIG. 13A, the crystallinity of the crystalline silicon layer 15 above the gate electrodes 12 degrades in relation to increase in the gate capacitance of the gate insulating layer 13 having the targeted thickness conforming to Condition 1, and, in contrast, the crystallinity of the crystalline silicon layer 15 above the gate electrode 12 improves in relation to increase in the gate capacitance. It is therefore possible to decrease the absorbance of the amorphous silicon layer 14 above the gate electrodes 12 as can be seen from FIG. 12A by forming the gate insulating layer 13 under a condition such that the thicknesses of the gate insulating layer 13 is included in the region 1 that is most appropriate. With this, it is possible to provide a negative correlation between the gate capacitance and the crystallinity of the crystalline silicon layer 15 formed above the gate electrodes 12 by laser irradiation (or provide a positive correlation between the gate capacitance and the half-width of the peak of the Raman scattering spectrum).

On the other hand, as can be seen from FIG. 13B and FIG. 13C, the correlation between the gate capacitance and the crystallinity of the crystalline silicon layer 15 above the gate electrodes 12 becomes less distinctive as the deviation of the targeted thickness from the appropriate range increases.

Figure 14A:
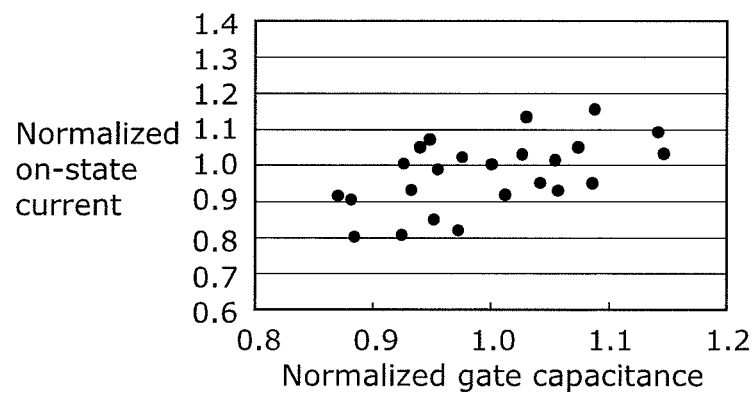
FIG. 14A shows a relationship between the capacitance of a gate insulating layer formed under Condition 1 and having varied thicknesses and the on-state current of thin-film transistors having a channel in a crystalline silicon layer.
Figure 14B:
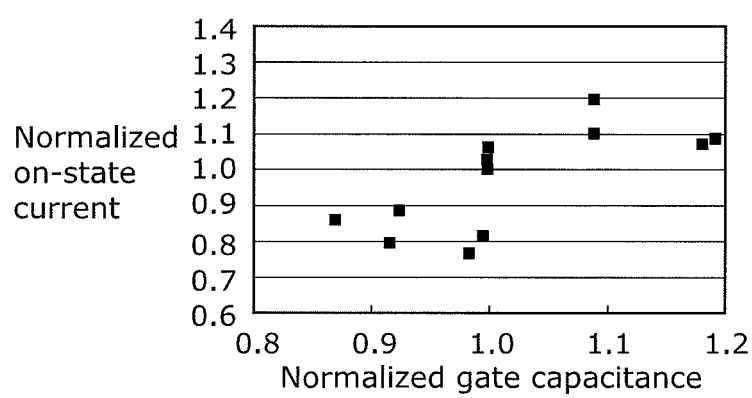
FIG. 14B shows a relationship between the capacitance of a gate insulating layer formed under Condition 2 and having varied thicknesses and the on-state current of thin-film transistors having a channel in a crystalline silicon layer.
Figure 14C:
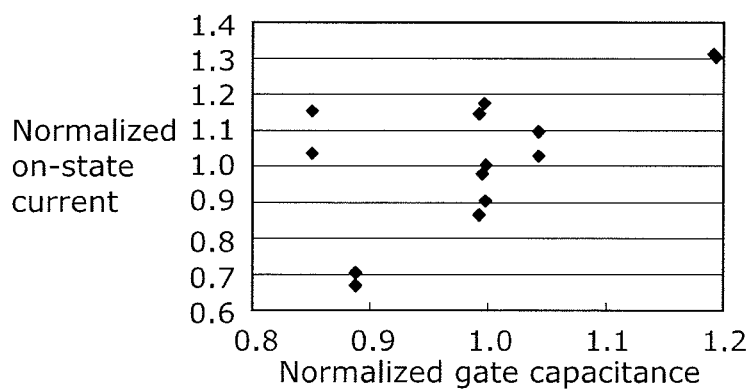
FIG. 14C shows a relationship between the capacitance of a gate insulating layer formed under Condition 3 and having varied thicknesses and the on-state current of thin-film transistors having a channel in a crystalline silicon layer.

FIG. 14A to FIG. 14C show relationships between the capacitance of the film having varied thicknesses and on-state current of the thin-film transistor 100 including the crystalline silicon layer 15 as a channel.

Specifically, FIG. 14A shows a correlation between the capacitance of the film having varied thicknesses and on-state current of the thin-film transistor 100 including, as a channel, the crystalline silicon layer 15 obtained by crystallizing the amorphous silicon layer 14 when the gate insulating layer 13 is formed using a target thickness conforming to Condition 1. The thin-film transistor array evaluated is formed on a glass substrate so as to include the crystalline silicon layer 15 obtained by crystallizing the amorphous silicon layer 14 under the aforementioned conditions for laser annealing. The on-state current was measured for one of the thin-film transistors 100 in the thin-film transistor array. The capacitance of the film having varied thicknesses is measured using a test element group (TEG) for gate capacitance evaluation formed close to the thin-film transistor 100. The gate capacitance and the on-state current in shown in FIG. 14A are normalized to the properties of the thin-film transistor 100 having the targeted thickness.

Likewise, FIG. 14B shows the case where the gate insulating layer 13 is formed using a target thickness conforming to Condition 2, and FIG. 14C shows the case where the gate insulating layer 13 is formed using a target thickness conforming to Condition 3.

As shown in FIG. 14A, the maximum and minimum values of the on-state current is within ±20% deviation from the center value when the gate insulating layer 13 is formed using the target thickness conforming to Condition 1, and thus the on-state current has variation smaller than when the gate insulating layer 13 is formed using the target thickness conforming to other conditions. FIG. 14B shows the maximum and minimum values of the on-state current which deviate from the center value by slightly more than ±20% when the gate insulating layer 13 is formed using the target thickness conforming to Condition 2.

In contrast, as shown in FIG. 14C, the on-state current has a large variation for the variation of the thicknesses in the channel region of the thin-film transistor when the gate insulating layer 13 is formed using a target thickness conforming to Condition 3, where the maximum and minimum values of the on-state current deviate from the center value by more than ±30%. As can be seen from the above-described cases, in conventional techniques, when films are formed so as to conform to a condition which minimizes that variation in the absorbance of the amorphous silicon layer 14 above the gate electrodes 12, variation in the crystallinity of the crystalline silicon layer 15 above the gate electrodes 12 can be reduced to a certain degree even when the thicknesses of the films in the channel layer of the thin-film transistor 100 are varied. However, when a plurality of the thin-film transistors 100 is manufactured within the surface of the substrate, it is still difficult to reduce variation in on-state currents of the thin-film transistors 100.

As can be seen from the above-described example, variation in the crystallinity of the crystalline silicon layer 15 above the gate electrode 12 for increase in the varied gate capacitances can be reduced by setting targeted thicknesses such that the films have thicknesses within the region A (and the region B) calculated as a range of thicknesses which produce the advantageous effect of the present embodiment, and within the region 1 (and the region 2) which are the ranges of the thicknesses more appropriate. As a result, the on-state properties of the thin-film transistors 100 can be uniformed even when the films have thicknesses deviating from the targeted thicknesses.

In conclusion, the gate insulating layer 13 and the amorphous silicon layer 14, which is to be laser annealed for crystallization, of the thin-film transistor 100 are formed using the respective target thicknesses so that the gate insulating layer 13 and the amorphous silicon layer 14 have the thicknesses within the ranges as calculated above. The absorbances of the amorphous silicon layer 14 above the gate electrodes 12 and the gate capacitances of the gate insulating layer 13 thereby have a negative correlation even when the thicknesses are varied above the substrate 10. With this, variation of the absorbances of the amorphous silicon layer 14 above the gate electrodes 12 due to the variation of the thicknesses of the amorphous silicon layer 14 can be reduced. In other words, using such targeted thickness can provide a negative correlation between the gate capacitance and the crystallinity of the crystalline silicon layer 15, which is generated by laser annealing the amorphous silicon layer 14, above the gate electrodes 12 even when the thicknesses are varied above the substrate 10. Accordingly, although the drive capability of the thin-film transistors 100 in the thin-film transistor array formed on the substrate 10 is varied due to the variation in the gate capacitance, the variation in the drive capability is offset by the crystallinity of the crystalline silicon layer 15. Consequently, the on-state properties of the thin-film transistors 100 in the thin-film transistor array are advantageously uniform over the surface of the substrate, which cannot be achieved using the conventional technique.

According to the aspects of the present invention, provided are a thin-film transistor array composed of thin-film transistors having uniform on-state properties, a method of manufacturing the same, and a display device in which such a thin-film transistor array is used.

Specifically, by using laser light having a wavelength within the visible spectrum, the crystalline silicon layer 15 can be formed to have crystallinity purposefully varied according to variation in the gate capacitance of the thin-film transistors 100. This provides a thin-film transistor array composed of thin-film transistors 100 having uniform on-state properties, a method of manufacturing the same, and a display device in which such a thin-film transistor array is used.

More specifically, by forming the amorphous silicon layer 14 and the gate insulating layer 13 each having thickness conforming to a predetermined condition, the crystalline silicon layer 15 above the gate electrode 12 is formed using laser light having a wavelength within the visible spectrum so that the crystalline silicon layer 15 can has crystallinity in a negative correlation with the gate capacitance. This produces an advantageous effect that variety in the drive capability of the thin-film transistor 100 due to variety in the gate capacitance is offset, and therefore provided are a thin-film transistor array composed of thin-film transistors 100 having uniform on-state properties on the substrate 10, a method of manufacturing the same, and a display device in which such a thin-film transistor array is used.

Figure 15:
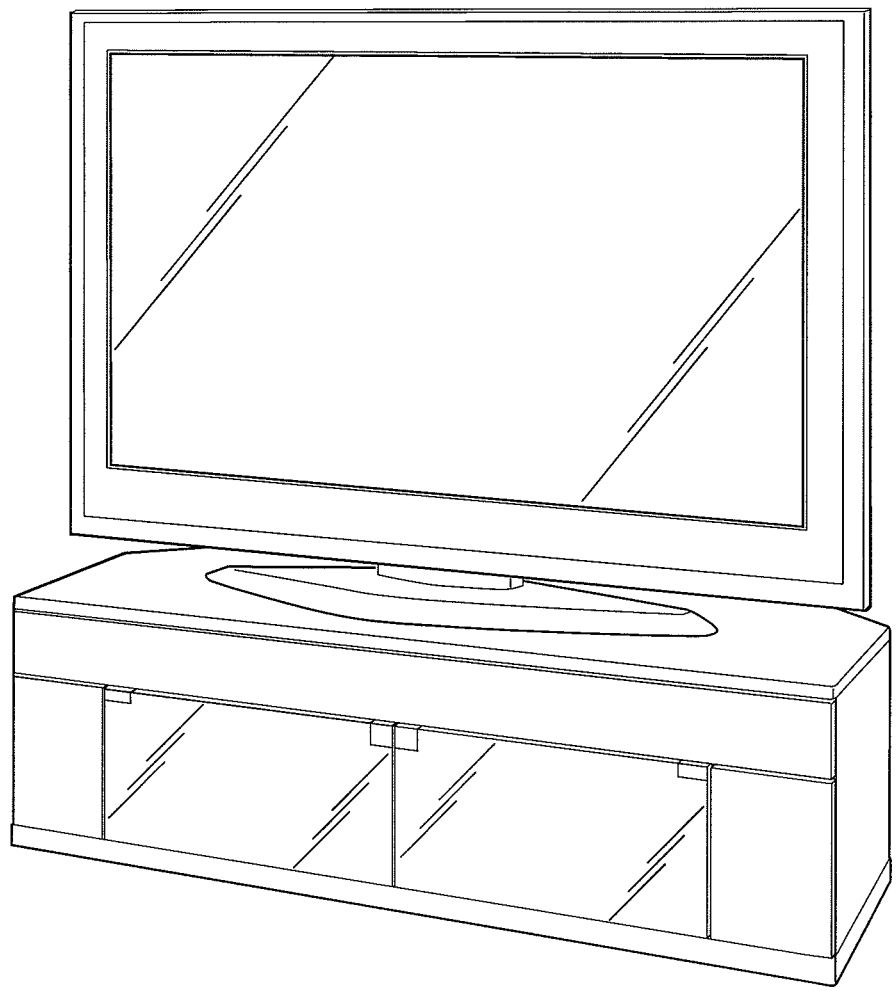
FIG. 15 is a diagram showing an example of a display device using the thin-film transistor array according to this disclosure.

Furthermore, a display device of high image quality with uniform transistor properties can be provided when the thin-film transistors according to the present invention are used in a display device as shown in FIG. 15. With such improvement in display quality, increased yields and reduced costs can also be achieved.

The advantageous effects according to the aspects of the present invention are produced only by setting thickness conditions in the aforementioned range, without a need for a particular change in thin-film transistor structure such as a pattern shape of the gate electrodes 12. Thus, superiority of the aspects of the present invention to the conventional technique is ensured in design flexibility even in the case of, for example, manufacturing a display device of a higher resolution.

Although the thin-film transistor array manufacturing method, the thin-film transistor array, and the display device in which the thin-film transistor array is used according to the aspect of the present invention have been described by way of the exemplary embodiment, the present invention is not limited to the embodiment. Although only an exemplary embodiment of this disclosure has been described in detail above, those skilled in the art will readily appreciate that many modifications are possible in the exemplary embodiments without materially departing from the novel teachings and advantages of this disclosure. Accordingly, all such modifications are intended to be included within the scope of this disclosure.

Industrial Applicability

The exemplary embodiment of this disclosure is applicable to a thin-film transistor array, a thin-film transistor array manufacturing method, and a display device including an LCD panel or an EL panel such as an organic EL panel in which the thin-film transistor array is used. In particular, the present invention is applicable to manufacture of a display device including an LCD panel or an organic EL panel of high image quality due to uniform on-state properties of the thin-film transistors included in the thin-film transistor array. The on-state properties are uniform even when the thicknesses of layers (an amorphous silicon layer and a gate insulating layer) composing the channels in the thin-film transistors on a large-size substrate are varied in the process of crystallization using a laser.

The invention claimed is:

1. A method of manufacturing a thin-film transistor array, the method comprising:
   preparing a substrate;
   forming a plurality of gate electrodes above the substrate;
   forming a gate insulating layer on the plurality of gate electrodes;
   forming an amorphous silicon layer on the gate insulating layer;
   generating a crystalline silicon layer by crystallizing the amorphous silicon layer using laser light emitted from a laser; and
   forming a source electrode and a drain electrode for each of the plurality of gate electrodes, the source electrode and the drain electrode being located in a region above the crystalline silicon layer,
   wherein in the forming of the gate insulating layer, the gate insulating layer is formed such that thicknesses of the gate insulating layer on the plurality of gate electrodes are within a range in which there is a positive correlation between light absorbance of the amorphous silicon layer above the plurality of gate electrodes for the laser light and equivalent oxide thicknesses of the gate insulating layer on the plurality of gate electrodes, and
   in the forming of the amorphous silicon layer, the amorphous silicon layer is formed such that thicknesses of the amorphous silicon layer above the plurality of gate electrodes is within a range in which variation of the light absorbance according to variation of the thicknesses of the amorphous silicon layer is within a predetermined range from a first standard.

2. The method of manufacturing the thin-film transistor array according to claim 1, wherein the laser includes a solid-state laser device.

3. The method of manufacturing the thin-film transistor array according to claim 1, wherein the laser includes a laser device using a semiconductor laser element.

4. The method of manufacturing the thin-film transistor array according to claim 1, wherein in the generating of the crystalline silicon layer, a variation of irradiation energy density of the laser light on the amorphous silicon layer is less than approximately 5%.

5. The method of manufacturing the thin-film transistor array according to claim 1, wherein the laser light has a wavelength from 400 nanometers to 600 nanometers.

6. The method of manufacturing the thin-film transistor array according to claim 1, wherein in the forming of the amorphous silicon layer, the amorphous silicon layer is formed to have the thicknesses within the range in which the light absorbances are within the predetermined range from the first standard so that a derivative of absorbance of the amorphous silicon layer for a laser light having a wavelength $\lambda$ differentiated with respect to an optical thickness of the amorphous silicon layer is from $-5$ to $+5$, the absorbance being normalized to an optical thickness of the gate insulating layer normalized to the wavelength $\lambda$ of the laser light, and the optical thickness of the amorphous silicon layer being normalized to the wavelength $\lambda$ of the laser light.

7. The method of manufacturing the thin-film transistor array according to claim 1, wherein in the forming of the amorphous silicon layer, the amorphous silicon layer is formed such that an average of the thicknesses of the amorphous silicon layer above the gate electrodes is within a range represented by Expression 1 below, and Expression 1 is $0.426 \leq n_{a\text{-}Si} \times d_{a\text{-}Si}/\lambda_{Si} \leq 0.641$, where $d_{a\text{-}Si}$ denotes the average of the thicknesses of the amorphous silicon layer, $\lambda_{Si}$ denotes a wavelength of the laser light, and $n_{a\text{-}Si}$ denotes a refractive index of the amorphous silicon layer for a laser light having a wavelength $\lambda$.

8. The method of manufacturing the thin-film transistor array according to claim 1, wherein in the forming of a gate insulating layer, the gate insulating layer is formed to have an extinction coefficient of 0.01 or below for a wavelength of the laser light.

9. The method of manufacturing the thin-film transistor array according to claim 1, wherein the gate insulating layer is a silicon oxide film.

10. The method of manufacturing the thin-film transistor array according to claim 1, wherein the gate insulating layer is a silicon nitride film.

11. The method of manufacturing the thin-film transistor array according to claim 1, wherein the gate insulation layer is composed of stacked films including a silicon oxide film and a silicon nitride film.

12. The method of manufacturing the thin-film transistor array according to claim 11, wherein in the forming of a gate insulating layer, the gate insulating layer is formed such that an average of thicknesses of the silicon oxide film above the plurality of gate electrodes and an average of thicknesses of the silicon nitride film above the plurality of gate electrodes are within one of a range represented by Expression 6 and Expression 7 below and a range represented by Expression 8 and Expression 9 below Expression 6 is $Y \geq -1070X^6 + 1400X^5 - 688X^4 + 153X^3 - 12.90X^2 - 1.02X + 0.43$, Expression 7 is $Y \leq 49.9X^6 - 131X^5 + 127X^4 - 56.8X^3 + 11.8X^2 - 2.01X + 0.736$, Expression 8 is $Y \geq -7.34X^6 + 8.48X^5 + 8.65X^4 - 16.0X^3 + 7.24X^2 - 2.04X + 0.961$, and Expression 9 is $Y \leq -3.75X^6 + 11.8X^5 - 13.1X^4 + 6.09X^3 - 1.12X^2 - 0.87X + 1.20$, where $X = d_{SiO} \times n_{SiO}/\lambda$ and $Y = d_{SiN} \times n_{SiN}/\lambda$, $d_{SiO}$ denotes the average of the thicknesses of the silicon oxide film, $d_{SiN}$ denotes the average of the thicknesses of the silicon nitride film, $\lambda$ denotes a wavelength of the laser light, $n_{SiO}$ denotes a refractive index of the silicon oxide film for the laser light having the wavelength $\lambda$, and $n_{SiN}$ denotes a refractive index of the silicon nitride film for the laser light having the wavelength $\lambda$.

13. The method of manufacturing the thin-film transistor array according to claim 11, wherein in the forming of a gate insulating layer, the gate insulating layer is formed such that an average of thicknesses of the silicon oxide film above the gate electrodes and an average of thicknesses of the silicon nitride film above the plurality of gate electrodes are within one of a range represented by Expression 10 and Expression 11 below and a range represented by Expression 12 and Expression 13 below, Expression 10 is $Y \geq -132.6X^6 + 181X^5 - 93.8X^4 + 21.3X^3 - 1.33X^2 - 1.04X + 0.473$, Expression 11 is $Y \leq 23.7X^6 - 4.56X^5 - 35.4X^4 + 27.2X^3 - 5.75X^2 - 0.973X + 0.619$, Expression 12 is $Y \geq 7.46X^6 - 32.4X^5 + 50.8X^4 - 35.7X^3 + 11.0X^2 - 2.20X + 1.04$, and Expression 13 is $Y \leq -5.34X^6 + 16.7X^5 - 18.7X^4 + 9.18X^3 - 1.96X^2 - 0.821X + 1.13$, where $X = d_{SiO} \times n_{SiO}/\lambda$ and $Y = d_{SiN} \times n_{SiN}/\lambda$, $d_{SiO}$ denotes the average of thicknesses of the silicon oxide film, $d_{SiN}$ denotes the average of thicknesses of the silicon nitride film, $\lambda$ denotes a wavelength of the laser light, $n_{SiN}$ denotes a refractive index of the silicon oxide film for the laser light having the wavelength $\lambda$, and $n_{siN}$ denotes a refractive index of the silicon nitride film for the laser light having the wavelength $\lambda$.

14. The method of manufacturing the thin-film transistor array according to claim 1, wherein in the forming of a gate insulating layer, the gate insulating layer is formed such that an average of the thicknesses of the gate insulating layer on the plurality of gate electrodes is within a range represented by one of Expression 2 and Expression 3 below, Expression 2 is $0.44 \leq n_{GI} \times d_{GI}/\lambda \leq 0.74$, and Expression 3 is $0.96 \leq n_{GI} \times d_{GI}/\lambda \leq 1.20$, where $d_{GI}$ denotes the average of the thicknesses of the gate insulating layer, $\lambda$ denotes a wavelength of the laser light, and $n_{GI}$ denotes a refractive index of the gate insulating layer for the laser light having the wavelength $\lambda$.

15. The method of manufacturing the thin-film transistor array according to claim 1, wherein in the forming of a gate insulating layer, the gate insulating layer is formed such that an average of the thicknesses of the gate insulating layer on the plurality of gate electrodes is within a range represented by one of Expression 4 and Expression 5 below, Expression 4 is $0.47 \leq n_{GI} \times d_{GI}/\lambda \leq 0.62$, and Expression 5 is $1.04 \leq n_{GI} \times d_{GI}/\lambda \leq 1.13$, where $d_{GI}$ is the average of the thicknesses of the gate insulating layer, $\lambda$ is a wavelength of the laser light, and $n_{GI}$ is a refractive index of the gate insulating layer for the laser light having the wavelength $\lambda$.

16. The method of manufacturing the thin-film transistor array according to claim 1, wherein in the forming of a plurality of gate electrodes, an undercoat layer composed of a transparent insulating film is formed on the substrate, and the plurality of gate electrodes is formed on the undercoat layer.

* * * * *